US010381500B2

(12) United States Patent
Rubio et al.

(10) Patent No.: US 10,381,500 B2
(45) Date of Patent: Aug. 13, 2019

(54) FLUID COOLED INTEGRATED PHOTOVOLTAIC MODULE

(71) Applicant: FAFCO INCORPORATED, Chico, CA (US)

(72) Inventors: Michael R. Rubio, Chico, CA (US); Robert Leckinger, Chico, CA (US); Alexander P. Ward, Chico, CA (US)

(73) Assignee: FAFCO INCORPORATED, Chico, CA (US)

( * ) Notice: Subject to any disclaimer, the term of this patent is extended or adjusted under 35 U.S.C. 154(b) by 946 days.

(21) Appl. No.: 14/725,825

(22) Filed: May 29, 2015

(65) Prior Publication Data

US 2015/0349178 A1    Dec. 3, 2015

Related U.S. Application Data

(63) Continuation-in-part of application No. 14/290,517, filed on May 29, 2014, now abandoned.

(51) Int. Cl.
| | |
|---|---|
| *H01L 31/0525* | (2014.01) |
| *H02S 40/42* | (2014.01) |
| *H02S 40/44* | (2014.01) |
| *H01L 31/024* | (2014.01) |
| *H01L 31/052* | (2014.01) |
| *H02S 20/00* | (2014.01) |
| *H02S 30/10* | (2014.01) |

(Continued)

(52) U.S. Cl.
CPC ............ *H01L 31/0525* (2013.01); *F28F 1/00* (2013.01); *F28F 21/062* (2013.01); *H01L 31/024* (2013.01); *H01L 31/0521* (2013.01); *H02S 20/00* (2013.01); *H02S 30/10* (2014.12); *H02S 40/425* (2014.12); *H02S 40/44* (2014.12); *Y02B 10/10* (2013.01); *Y02B 10/20* (2013.01); *Y02B 10/70* (2013.01); *Y02E 10/50* (2013.01); *Y02E 10/60* (2013.01)

(58) Field of Classification Search
USPC .................................................. 136/243–265
See application file for complete search history.

(56) References Cited

U.S. PATENT DOCUMENTS

| | | |
|---|---|---|
| 3,934,323 A | 1/1976 | Ford et al. |
| 3,982,723 A | 9/1976 | Ford et al. |

(Continued)

FOREIGN PATENT DOCUMENTS

| | | |
|---|---|---|
| EP | 2111520 A4 | 10/2009 |
| WO | WO 2009/061495 A1 | 5/2009 |

*Primary Examiner* — Dustin Q Dam

(57) ABSTRACT

A fluid cooled photovoltaic module in which a polymer heat exchanger transfers heat from the photovoltaic module to a circulated fluid. The photovoltaic module is maintained at a cool temperature enabling increased power output while the heat transferred to the circulated fluid can be useful for applications that require heat. A polymer heat exchanger is specifically utilized to achieve a robust design that is cost effective; high performance; easily adaptable to various photovoltaic module types and sizes; compatible with conventional photovoltaic module balance of systems; light weight; resistant to water sanitizers and other chemicals; resistant to lime-scale buildup and heat exchanger fouling; corrosion resistant; easily transported, assembled, installed, and maintained; and leverages high production manufacturing methods.

19 Claims, 18 Drawing Sheets

(51) Int. Cl.
*F28F 21/06* (2006.01)
*F28F 1/00* (2006.01)

(56) References Cited

U.S. PATENT DOCUMENTS

| | | |
|---|---|---|
| 4,020,828 A | 5/1977 | Steed |
| 4,098,331 A | 7/1978 | Ford et al. |
| 4,119,334 A | 10/1978 | Steed |
| 4,205,662 A | 6/1980 | Rhodes et al. |
| 4,243,454 A | 1/1981 | Rhodes |
| 4,407,477 A | 10/1983 | Backlund et al. |
| 4,598,450 A | 7/1986 | Thompson et al. |
| 5,505,788 A | 4/1996 | Dinwoodie |
| 5,979,548 A | 11/1999 | Rhodes et al. |
| 6,038,768 A | 3/2000 | Rhodes |
| 6,158,499 A | 12/2000 | Rhodes et al. |
| 6,295,818 B1 | 10/2001 | Ansley et al. |
| 6,487,768 B2 | 12/2002 | Rhodes |
| 6,581,273 B1 | 6/2003 | Rhodes |
| 6,675,580 B2 | 1/2004 | Ansley et al. |
| 6,709,616 B2 | 3/2004 | Rhodes |
| 6,722,358 B2 | 4/2004 | Rhodes |
| 7,328,509 B2 | 2/2008 | Rhodes |
| 7,398,779 B2 | 7/2008 | Bowen |
| 8,476,522 B2 | 7/2013 | Schultz et al. |
| 2007/0227529 A1* | 10/2007 | Rubio .............. F24D 17/0021 126/614 |
| 2009/0065046 A1* | 3/2009 | DeNault .............. H02S 40/44 136/248 |
| 2011/0259402 A1* | 10/2011 | Schultz ............... F24S 10/502 136/248 |
| 2012/0097217 A1* | 4/2012 | Yin .................... H02S 40/44 136/248 |
| 2014/0103855 A1* | 4/2014 | Wolter ................. H02J 7/35 320/101 |

\* cited by examiner

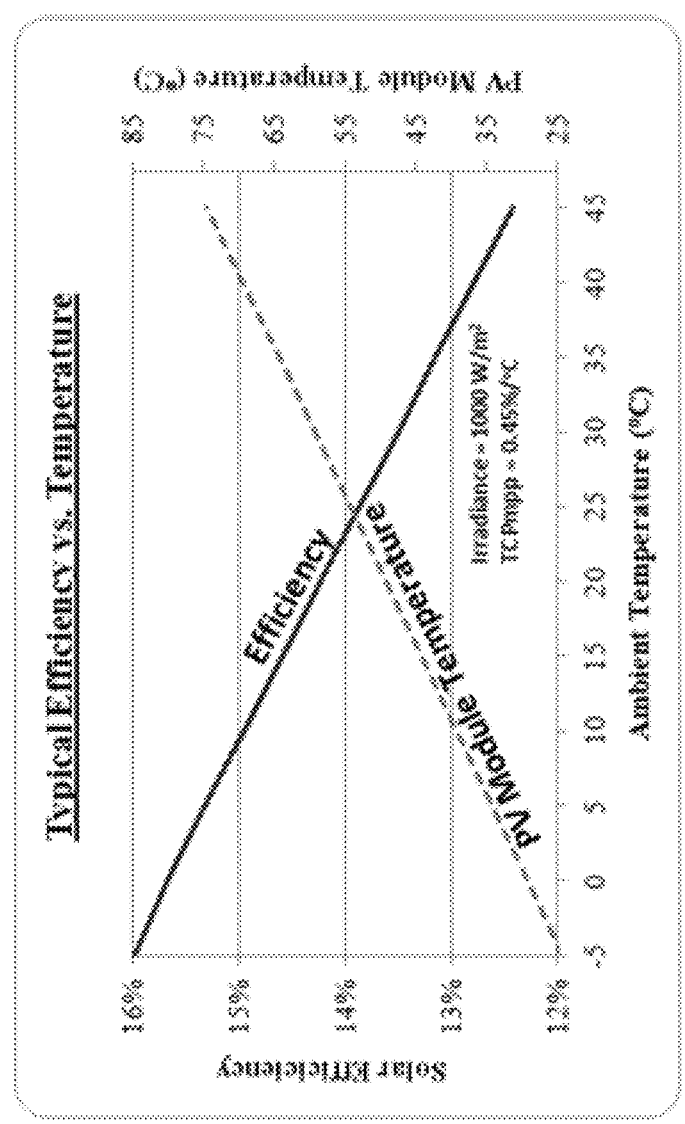
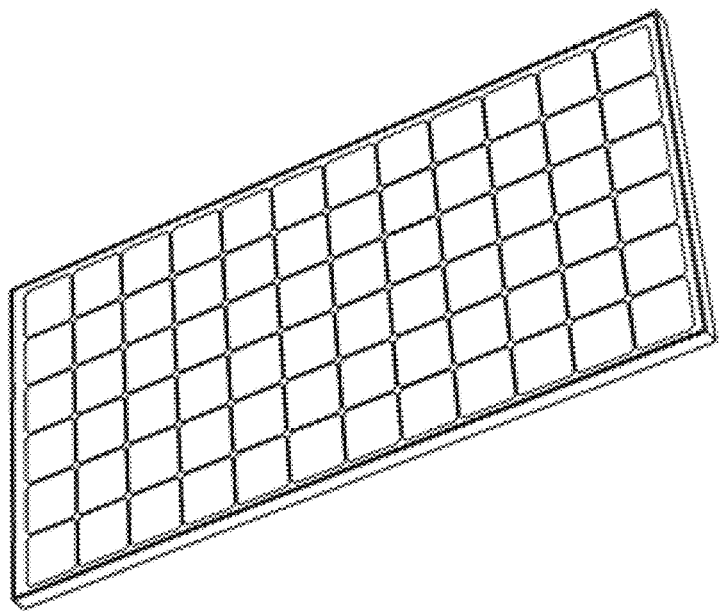
FIG. 6

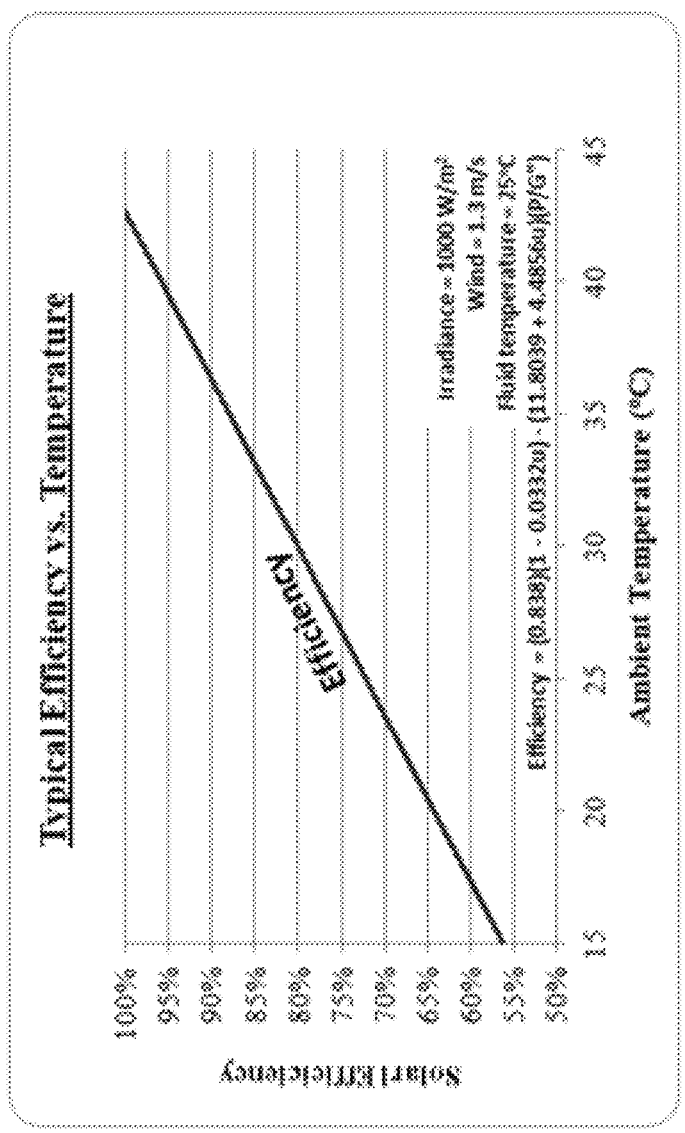
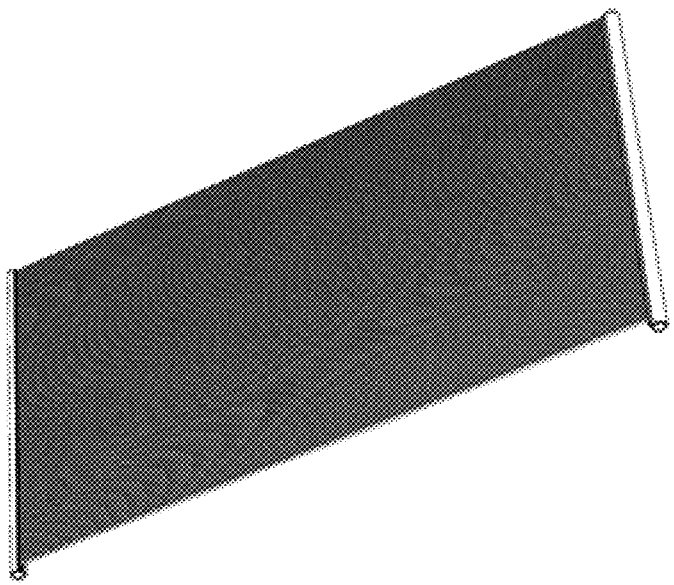
FIG. 7

FLUID COOLED INTEGRATED PHOTOVOLTAIC MODULE

CROSS-REFERENCE TO RELATED APPLICATIONS

This application is a Continuation-In-Part application of, and claims priority to, U.S. Nonprovisional patent application Ser. No. 14/290,517, filed May 29, 2014, which is related to U.S. Nonprovisional patent application Ser. No. 14/201,652, filed Mar. 7, 2014, which claims the benefit of U.S. Provisional Patent Application No. 61/778,204, filed Mar. 12, 2013, all of which are commonly assigned and incorporated by reference herein for all purposes.

BACKGROUND OF THE INVENTION

The present invention relates to photovoltaic devices and applications. More specifically, embodiments of the present invention provide a fluid cooled photovoltaic module assembly and related methods.

Efficient renewable energy conversion mechanisms are sought to offset worldwide fossil fuel consumption. The International Energy Agency (EA) estimates world energy use in 2010 to be 150 trillion kilowatt-hours, which is roughly 0.02% of annual global solar energy. This illustrates that solar energy has the potential to supply all of the world's energy with effective solar energy conversion and storage technologies. Oil, coal, and natural gas remain the primary utilized world energy sources which presents an opportunity for new technologies and strategies to enable solar energy to become practical and cost competitive.

Photovoltaic (PV) modules convert solar radiation into electricity using semiconductors that exhibit the photovoltaic effect. Substantial investment into photovoltaic module design and manufacturing are driving down costs of photovoltaic systems. Efficiencies of photovoltaic modules remain relatively low at less than 25% and typically below 18% efficiency. Photovoltaic module efficiencies are further reduced as the temperature rises from heating up in the sun. This efficiency reduction is published on product specification sheets in the form of a temperature coefficient.

Solar thermal (ST) collectors convert solar radiation to heat using absorptive surfaces and heat loss mitigation techniques. Enabled by high efficiencies which can exceed 90%, solar thermal accounts for more renewable energy capacity worldwide than photovoltaics. Solar thermal collectors have high conversion efficiencies when they are maintained at cool temperatures. This is enabled by utilizing solar thermal collectors for distinct applications in which cool water is heated such as swimming pools, preheating potable water, and commercial/industrial processing. Efficiencies are highly dependent upon environmental variables and fluid temperature. Polymer unglazed solar thermal collectors have advantages such as low cost, ease of manufacturing in different sizes, lightweight, tolerant of freezing conditions, resistant to water sanitizers and other chemicals; resistant to lime-scale buildup and heat exchanger fouling; resistant to corrosion; easily transported, and resistant to ultraviolet radiation.

There have been many types of photovoltaic devices and methods. Unfortunately, they have been inadequate for various applications. Prior art has claimed the enhanced performance of combined photovoltaic and solar thermal, but failed to make a functional, practical, and efficient combination. Therefore, improved photovoltaic devices and methods are desired.

BRIEF SUMMARY OF THE INVENTION

The present invention relates to photovoltaic devices and applications. More specifically, embodiments of the present invention provide a fluid cooled photovoltaic module assembly and related methods. By combining photovoltaic and solar thermal technologies the energy output can be three to five times greater than that of a photovoltaic module alone, along with numerous other benefits. The present invention describes a successful combination of a photovoltaic module and polymer heat exchanger which yields increased electrical output as well as usable heat, substantially increasing the utilization of available solar energy.

The fluid cooled photovoltaic module assembly is comprised of a framed glass photovoltaic module, a polymer heat exchanger nested behind the photovoltaic module, a back structure, such as a polymer backsheet supporting the polymer heat exchanger and mounting hardware or a pair of header structures and a plurality of spar structures. The assembly is mounted on a rail system for roof or rack configurations. The polymer heat exchanger and back structure are nested behind the photovoltaic module within its frame. The polymer heat exchanger tube sheet is pressed against the back side of the photovoltaic module enabling effective thermal contact. The frame provides structure for the assembly.

The rigid assembly and available engineered photovoltaic mounting hardware makes possible high wind load resistance, elevated mounting off the roof deck, ability to tie solar collectors to structural members, minimal roof penetrations, and avoidance of debris collection. This is a significant improvement compared to modern unglazed polymer solar collector mounting which typically has substantially more roof penetrations, lays the solar collector directly on the roof deck, and requires a separate rigid support structure when elevating off the roof or on a ground rack. The invention enables photovoltaic modules and solar thermal collectors to share the best available mounting location, such as a South facing roof. This further reduces mounting penetrations compared to mounting photovoltaic modules and solar thermal collectors in separate locations.

The assembly has the advantage of easily adapting to and being compatible with various photovoltaic modules. The photovoltaic module can be any size and type such as monocrystalline silicon, polycrystalline silicon, amorphous silicon, cadmium telluride, and copper indium gallium selenide/sulfide. This leverages evolved cost efficiencies in the photovoltaic module market such as low cost frames, glass, photovoltaic cells, encapsulants, and internal back sheets; automated assembly processes; state of the art manufacturing facilities; materials optimizations; and engineered components. By adapting to standard and market leading photovoltaic modules, this assembly leverages evolved electrical, mechanical, and structural balance of system cost efficiencies as well.

Where the photovoltaic module is not modified, existing listings and certifications can be maintained. In alternate embodiments, the photovoltaic module may be modified or customized around the polymer heat exchanger. The heat exchanger, back structure, and closure profiles are non-metallic and therefore have no electrical or grounding implications on the photovoltaic module such as shorts or ground faults. Structural assessments of the PV module and mounting system can be maintained. The mounting orientation of the photovoltaic module can be portrait or landscape so as not to limit mounting options (i.e. low slope roofs, ballast mounts, ground racks, etc.)

Cooling can extend the life of the photovoltaic module and its heat sensitive components such as junction box with diodes or possibly microinverter or power optimizer. High quality modules and cells are necessary to avoid cell overheating and micro-crack induced hot spots. In this case, the temperatures of the photovoltaic module and heat exchangers using commodity polymers are well matched. To utilize lower quality modules or modules with hot spot sensitivities, an engineered temperature polymer can be utilized for the polymer heat exchanger.

The polymer heat exchanger is typical of an unglazed polymer solar collector used in solar pool heating and potable water preheating systems. It is comprised of an outdoor grade polymer tube sheet that fills the area behind the photovoltaic module cells enabling effective and uniform cooling of all the photovoltaic cells. In prior art, such as WO 2009061495 A1, not all cells are uniformly cooled which limits electrical improvement to the hottest cell in each string of cells. The tube sheet is connected to manifolds on two sides. The manifolds have connections enabling them to be plumbed together to enable parallel fluid flow through rows of panels underneath photovoltaic modules. Polymer connections enable simple plumbing, repair, and replacement by leveraging modern PEX type fittings (push, crimp, flare, etc.), barb/hose/clamp connections (typical of solar pool collectors), gasket and o-ring type, and fusion welded connections. The manufacturing process of the polymer heat exchanger allows it to be easily configured for various photovoltaic module sizes. The polymer heat exchanger has advantages of being cost effective with large heat transfer area, ease of manufacturing in different sizes, lightweight, tolerant of freezing conditions, resistant to water sanitizers and other chemicals; resistant to lime-scale buildup and heat exchanger fouling; resistant to corrosion; easily transported, and resistant to ultraviolet radiation.

The heat transfer performance is not limited by the low thermal conductivity of the polymer due to the relatively low available solar flux and large surface area of the polymer heat exchanger. The assembly's lightweight enables mounting to the majority of commercial/industrial roofs which are weight limited.

The polymer backsheet has a height that is slightly more than the distance between the back of the frame and back of tube sheet when pressed against the back of the photovoltaic module. The backsheet design ensures the polymer heat exchanger maintains uniform and direct contact with the back of the photovoltaic module in order to have effective thermal transfer. The use of thermoset backsheet maintains constant uniform compression force over the product lifetime since the spring forces are well within the elastic limit and not subject to thermal deflection or creep. The backsheet has no rough edges that can abrade the polymer heat exchanger or it has closure or trim pieces to cover any rough edges. When mounted on the rail system, the assembly is tight and the tube sheet is firmly pressed against the back of the photovoltaic module, but not so hard as to damage the backsheet or photovoltaic module. Prior art has sought to achieve a thermal interface between a photovoltaic module and polymer heat exchanger without success due to delamination induced by thermal expansion/contraction by using adhesives in the case of U.S. Pat. No. 6,675,580 B2. The present invention eliminates the need for any secondary interfacing material between the photovoltaic module and heat exchanger. The two are put into direct mechanical contact. The method of nesting the polymer heat exchanger inside the photovoltaic module avoids issues with differential expansion, creep, sagging, binding and general ease of assembly, service and disassembly. The polymer heat exchanger is constrained at the top of the assembly and the tube sheet and bottom manifold are allowed to freely expand and contract within the rigid frame structure. The soft material of the tube sheet eliminates any potential abrasion wear on the back of the photovoltaic module. Some photovoltaic modules have glass backsheets which further mitigates potential abrasion.

The cooled photovoltaic system includes a typical photovoltaic electrical system along with a typical solar thermal system. Fluid is circulated by a pump through the polymer heat exchangers nested in the photovoltaic modules and through a load requiring heat. Typical applications include providing solar electricity while heating swimming pools, potable water for homes, apartments, hotels/motels, retirement homes, laundromats, process heating, commercial and industrial heating. Advantages as a solar pool heater include enabling pool pumps to be operated during expensive utility peak hours which typically coincide with daytime hours. This enables pool pumps to be used to circulate pool water through the solar collectors during the daytime at a lower cost. It is particularly advantageous for swimming pool heating because of the polymer's compatibility with pool sanitizing chemicals as opposed to commodity metals. The assembly can also be configured in a system with a heat pump, which can utilize the electricity to contribute to compressor operation and the low temperature heat to create higher temperature heat.

The combined electricity and heat output of a cooled photovoltaic module can produce 2 to 4 times more energy than the output of a typical photovoltaic module. The cooled photovoltaic module electrical output can be increased by more than 20% based on photovoltaic module stagnation testing and published photovoltaic module temperature coefficients. Considering that the framed glass photovoltaic module acts somewhat like a glazed collector enclosure for the polymer heat exchanger, it also enables increased thermal performance compared to unglazed polymer solar collectors in windy conditions.

Many benefits are achieved by way of the present invention over conventional embodiments and techniques. These implementations provide several means of maintaining or improving photovoltaic conversion efficiency and reliability, which can be tailored depending on various requirements of specific applications. A further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

FIG. 6 illustrates data for a photovoltaic module according to an embodiment of the present invention.

FIG. 7 illustrates data for a thermal module according to an embodiment of the present invention.

DETAILED DESCRIPTION OF THE INVENTION

Figure 1:
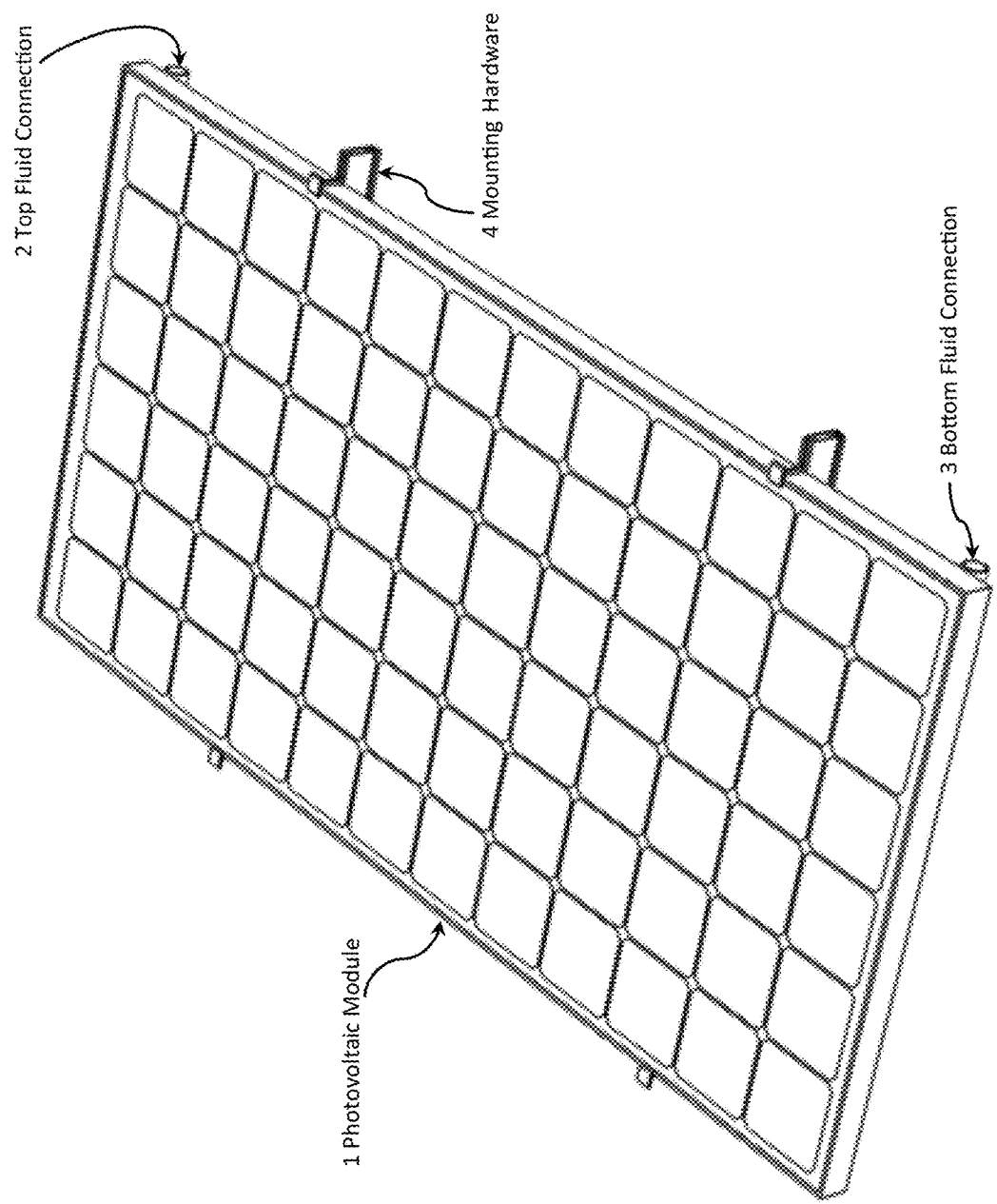
FIG. 1 is a perspective view of an assembly according to an embodiment of the present invention.

The present invention relates to photovoltaic devices and applications. More specifically, embodiments of the present invention provide a fluid cooled photovoltaic module assembly and related methods. By combining photovoltaic and solar thermal technologies the energy output can be three to five times greater than that of a photovoltaic module alone, along with numerous other benefits. The present invention describes a successful combination of a photovoltaic module and polymer heat exchanger which yields increased electrical output as well as usable heat, substantially increasing the utilization of available solar energy.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Figure 2:
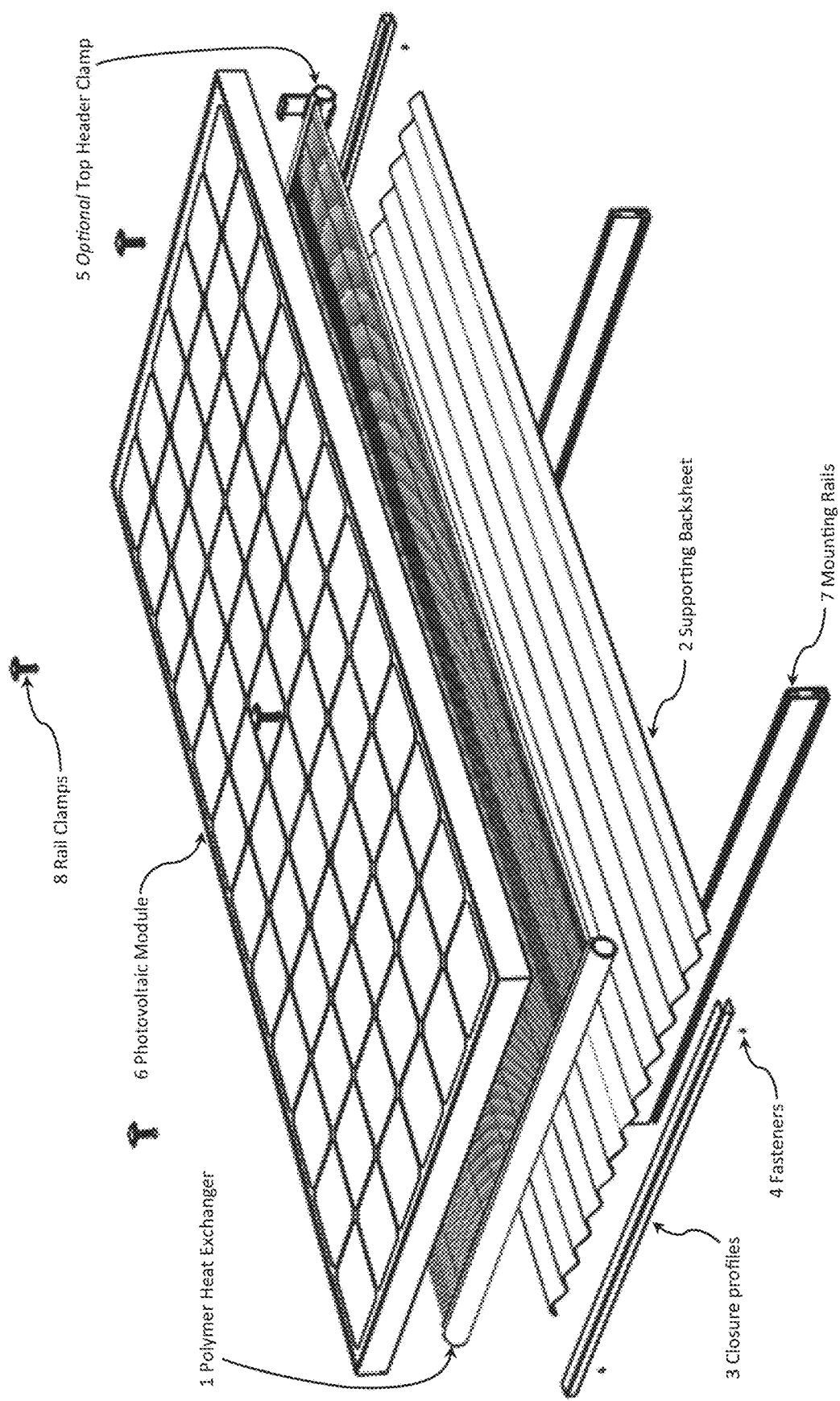
FIG. 2 is an exploded view of an assembly according to an embodiment of the present invention.
Figure 3:
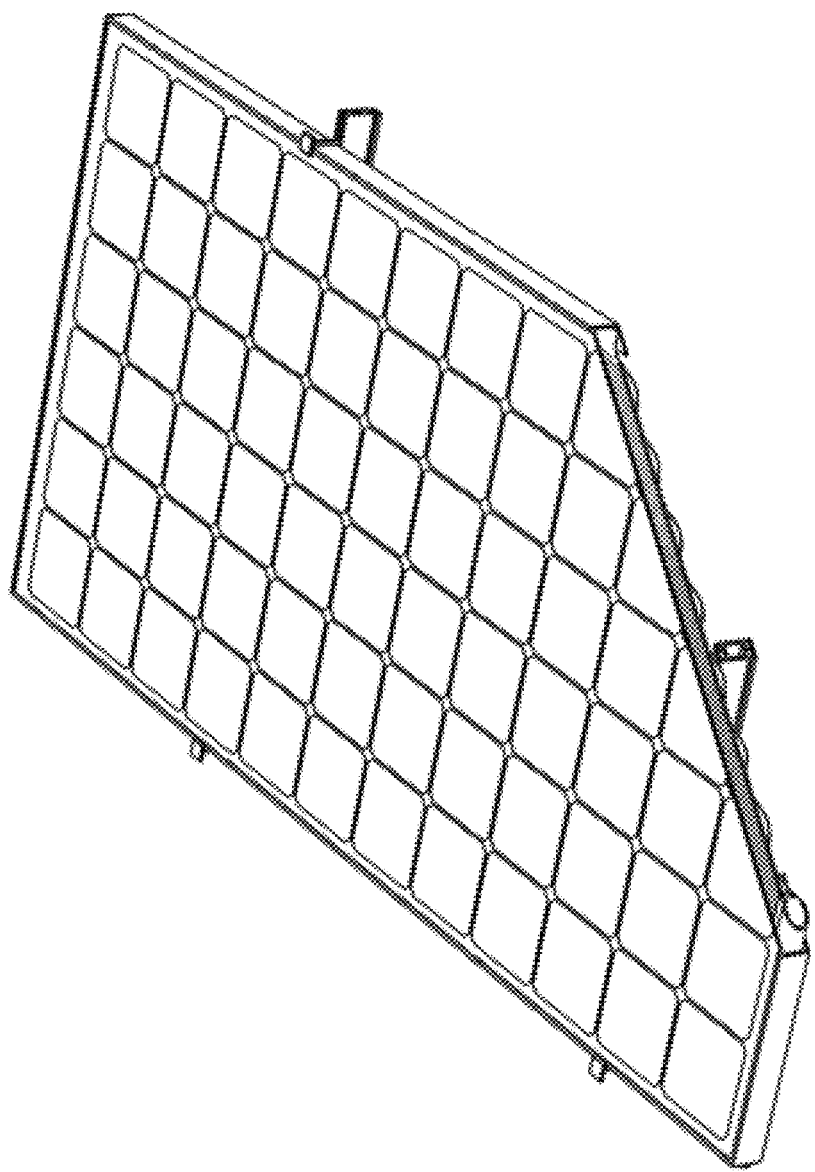
FIGS. 3, 4, and 5 are various alternative views of the assembly according to an embodiment of the present invention.
Figure 4:
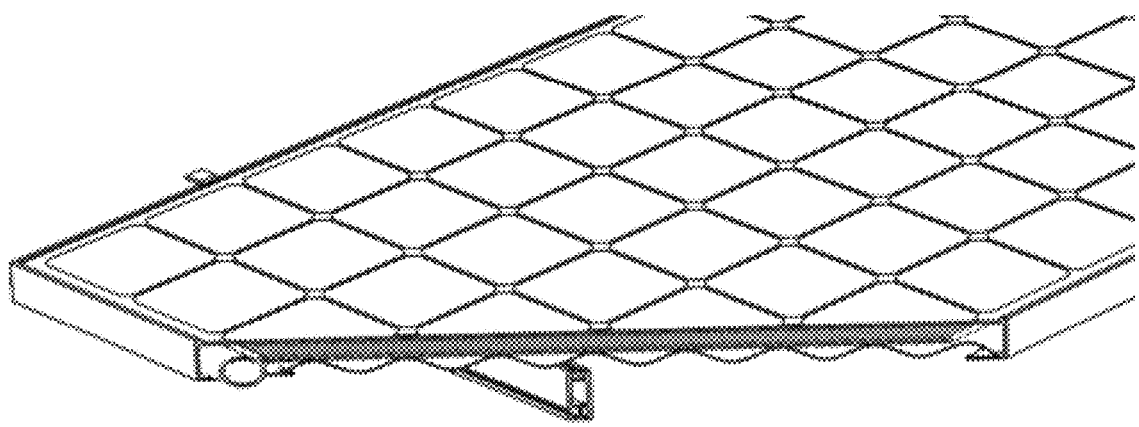
Figure 5:
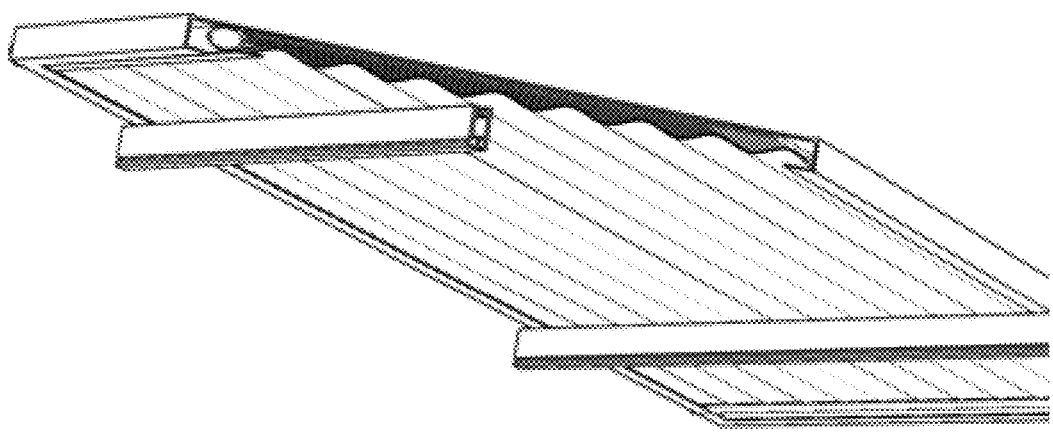

An assembly with photovoltaic module 1, top fluid connection 2, bottom fluid connection 3, and mounting hardware 4 is shown in FIG. 1. An exploded view of the assembly in FIG. 2 shows a polymer heat exchanger 1 with supporting backsheet 2, closure profiles 3, fasteners 4, and top header clamp 5 nested underneath a framed glass photovoltaic module 6. The frame provides structure for the assembly. The assembly is mounted on a rails 7 and secured with rail clamps 8 for roof or rack configurations, which presses the polymer heat exchanger tube sheet against the back side of the photovoltaic module. The polymer heat exchanger can be mounted either in a portrait or landscape orientation. The components can be assembled at a factory, warehouse, jobsite, ground or in final mounting position. The components can be configured into a photovoltaic module cooling kit that is provided to others (i.e. manufacturers, distributors, contractors, etc.) to integrate into their photovoltaic modules. Cross sections of the assembly are shown in FIG. 3, FIG. 4, and FIG. 5.

The photovoltaic module, shown in FIG. 6, is a typical 60 cell, 72 cell, 96 cell, or 128 cell crystalline silicon framed glass type which represents the majority of photovoltaic modules currently manufactured and sold around the world today. Where existing photovoltaic modules are utilized, they are not modified which enables their existing listings and certifications to be maintained. The photovoltaic solar module glass provides a firm and flat surface for the polymer heat exchanger to press against. The photovoltaic module glass and thin composite of cells, encapsulant, and film sheet are moderately thermally conductive promoting heat transfer. In certain conditions, the PV module glass may act as a conductive path for heat to be uniformly transferred to the heat exchanger, including the area above the junction box where the heat exchanger is not in contact.

In alternate embodiments, the photovoltaic module may be modified to accommodate the manifold in various ways, move the junction box to enable the heat exchanger to be in direct contact of the area above the junction box location, or other modified enhancements. The photovoltaic module can also have two layers of glass, or be frameless and/or utilize a non-glass front sheet. In the frameless version, a polymer heat exchanger with low thermal expansion may be utilized to enable alternate interface solutions. Where the photovoltaic module has two layers of glass, it may omit an opaque backsheet allowing sunlight to shine directly on the polymer heat exchanger. This can further increase thermal performance. Where the backsheet is opaque, it can be various colors such as black or white. A black backsheet and frame can have increased heat output due to their absorptive dark color. The photovoltaic module can have front or back contact crystalline silicon cells, but also thin film with cells such as cadmium telluride (CdTe), copper indium gallium selenide (CIGS) and amorphous silicon (a-Si). The photovoltaic module can also include a microinverter or power optimizer which can be cooled by the polymer heat exchanger to increase performance and extend design life. Slots can be cut in the photovoltaic module frame for the manifold pipe or connections to fit through. The junction box can be relocated to underneath or outer frame to allow the polymer heat exchanger to directly contact the back of the cells above the junction box as well as eliminate polymer heat exchanger modifications such as slits in the tube sheet for the junction box and wires.

Unglazed polymer solar thermal collectors account for over 90% of the solar thermal capacity in the United States (Source IEA 2012), largely enabled by the work of FAFCO, INC. first described in U.S. Pat. No. 3,934,323, Solar heat exchange panel and method of fabrication, commonly assigned, and hereby incorporated by reference herein.

The polymer heat exchanger, shown in FIG. 7, is comprised of 100 to 300 tubes small diameter tubes in parallel in a solid sheet with diameters of ⅛" to ⅜", overall sheet dimensions that nearly match the inner dimensions of a framed PV modules (39+/−3"×66"+/−3" for 60 cell modules, 39+/−3"×78"+/−3" for 72 cell modules, 42+/−3"×62"+/−3" for 96 cell modules, and 39+/−3"×81"+/−3" for 128 cell modules) and manifold pipes with diameters of ½" to 2" which have connections at each end which facilitate ganging heat exchangers together. The manifold pipes are situated such that they are below the tube sheet. The tube sheet extends near the inner corners of the PV module where it has a slight radius. The two photovoltaic module wires extend from the junction box through two slits in the tube sheet. The tube sheet is pressed against the back of the photovoltaic module around the perimeter of the junction box as well as behind the junction box. The heat exchanger can be easily removed or pushed aside for junction box access. In alternate embodiments, the polymer heat exchanger can have separated parallel tubes, tube and fins or webs, have one or more serpentine tubes, or be a thin film sheet with integral tube and manifold flow channels. In the thin film embodiment, the sheet can be easily routed around the junction box, but requires a structurally enhanced backsheet when used in applications which impart moderate fluid pressure. The polymer heat exchanger may also have an integral back sheet such as a fluted profile that has structural integrity. Conductive materials can also be utilized to enhance thermal performance.

The tube sheet and manifold pipe configuration of the polymer heat exchanger enables it to take high pressure by resolving pressure through hoop stress. This avoids structural reinforcement which would be required in heat exchanger designs that cannot take high pressure such as a bladder type design. The parallel tube configuration of the polymer heat exchanger enables fluid to be circulated at a high flow rate with little pressure drop reduction. Circulating the fluid at higher flow rates enables higher efficiencies by maintaining a lower average temperature of the solar panel assembly, while simultaneously ensuring even flow in all modules. The tube sheet with small diameter tubes has small valleys between tubes. The thickness of the tubes is minimized to improve heat transfer, but is sufficient to maintain adequate hoop strength with safety factor depending on the application. A commodity polymer such as polyethylene or polypropylene is utilized which can meet all the material requirements. In alternate embodiments, the polymer heat exchanger can be routed around the photovoltaic module junction box. The manifold pipe can be routed around or under the junction box. Various manifold pipes and pipe to tube sheet configurations can be utilized such as a header that is welded beneath the tube sheet or D-shaped, U-shaped header, or Z shaped manifold pipes.

Figure 8:
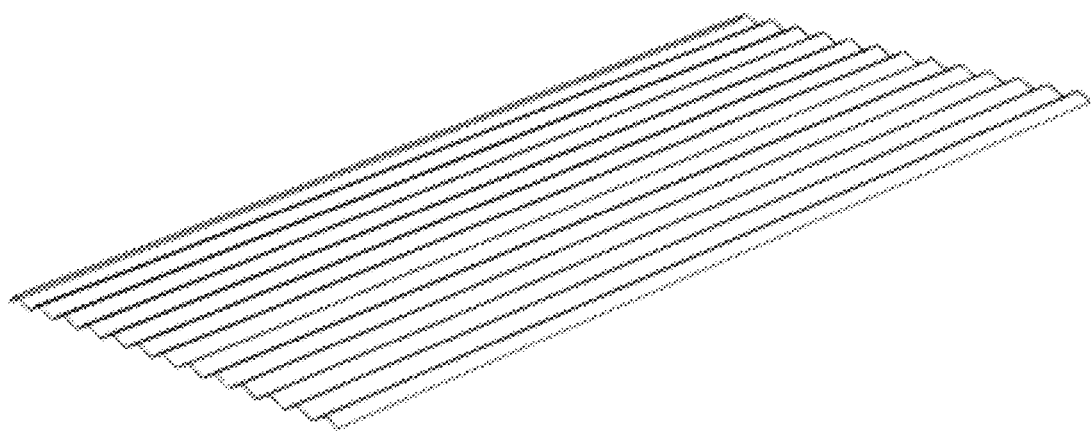
FIG. 8 is a back-sheet according to an embodiment of the present invention.

The backsheet, shown in FIG. 8, is a corrugated polymer thermoset (i.e. polycarbonate or FRP) with height that is slightly more than the distance between the back of the frame and back of tube sheet when pressed against the back of the PV module. The corrugations are roughly 1 inch apart. The corrugated backsheet acts as spring which retains its shape because it is made of a thermoset and the deformation is within its elastic limit. Extruded polymer closure profiles at each end of the corrugated sheet are fastened (i.e., screws) through the valleys of the corrugated sheet, away from contact with the heat exchanger tube sheet. When mounted on the rail system, the assembly is tight and the tube sheet is firmly pressed against the back of the PV backsheet, but not so hard as to damage backsheet or PV module. In alternate embodiments, the backsheet can be insulated, be an insulation board, be metal, be separated ribs, utilize a fluted profile, or enhanced with conductive materials. In a version without mounting rails which uses a rail-less mounting system, the structural backsheet can be sufficient support.

Figure 9:
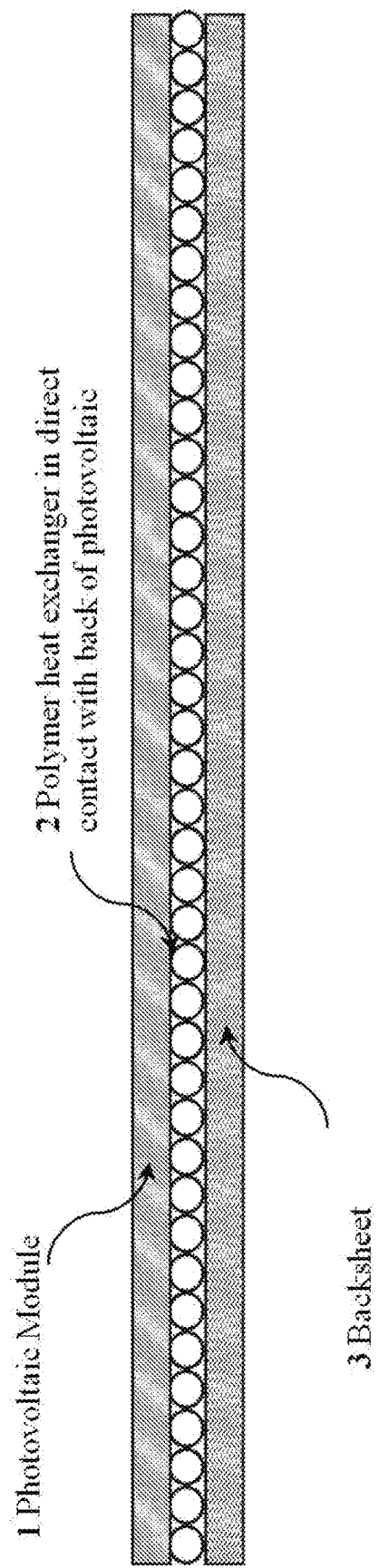
FIG. 9 is a cross-sectional view of the present assembly according to an embodiment of the present invention.

FIG. 9 is a cross-sectional view of the present assembly according to an embodiment of the present invention. This diagram is merely an example, which should not unduly limit the scope of the claims herein. As shown, the assembly includes the photovoltaic module, a thermal solar module including the plurality of tubes, and a backsheet. As shown, the upper region of the photovoltaic modules is directly in contact with the thermal solar module to draw heat from the photovoltaic module to the thermal solar module to facilitate heating therein of the fluid.

Effective heat transfer between the photovoltaic module and polymer heat exchanger is dependent upon by direct contact between the back surface of the photovoltaic module and top surface of the polymer heat exchanger. This is enabled within this embodiment with the spring-like corrugated backsheet that applies constant pressure to the back of the polymer heat exchanger, large available heat transfer area of the polymer heat exchanger, the thin wall tube sheet with semi-conductive commodity polymers (polyethylene or polypropylene), uniform flow of the polymer heat exchanger, complete coverage behind PV cells and slight thermal conductance of the composite. Testing has shown the heat output of the assembly to be comparable to the high efficient output of unglazed solar pool heating collectors.

In an example, the photovoltaic module itself is substantially flexible as proven by testing that rolled it into a ten (10) inch diameter cylinder with no measureable performance damage. The photovoltaic module can be effectively used as stand-alone to output electrical power, but cannot output useable heat, which is enabled by the combination with solar thermal absorber. In this flexible form, the module can be mounted directly upon a flat surface such as roof sheathing or conformed around a surface with a diameter of 10 inches or more. This allows the module to become integrated into the roof or mounting surface.

The combination solar thermal and photovoltaic module can also be created without the frame. In this configuration, a solar thermal—photovoltaic interface material is used that either constrains the coefficient of thermal expansion of the entire assembly or allows it repetitively expand and contract dynamically over the life of the assembly. In the version where the coefficient of thermal expansion is constrained, no interface material is used.

When the photovoltaic module is framed, it becomes less flexible and semi-rigid. The advantage of this configuration is that it enables this large format module to be mounted above a non-flat surface such as common roof material (asphalt shingles, tile, rack, etc.). Elevating the module above the roof surface, rather mounting directly flush to the roof surface promotes roof material longevity and prevents the module from deforming around irregular roof material surfaces. The integrity of this framed version with its integrated mounting hardware has been tested to withstand over wind speeds up to 155 mph, although there can be variations. The framed version can be used with and without the solar thermal collector.

In an alternative example, the combination solar thermal and photovoltaic module can also be used with copper indium gallium selenide (CIGS) or other types of non-glass photovoltaic modules. In these configurations, the photovoltaic module fabrication process is external to the combination solar thermal and photovoltaic module production process. The utilization of alternate photovoltaic modules enables the combination solar thermal and photovoltaic module to be used with any number of commercially available photovoltaic modules.

Figure 10:
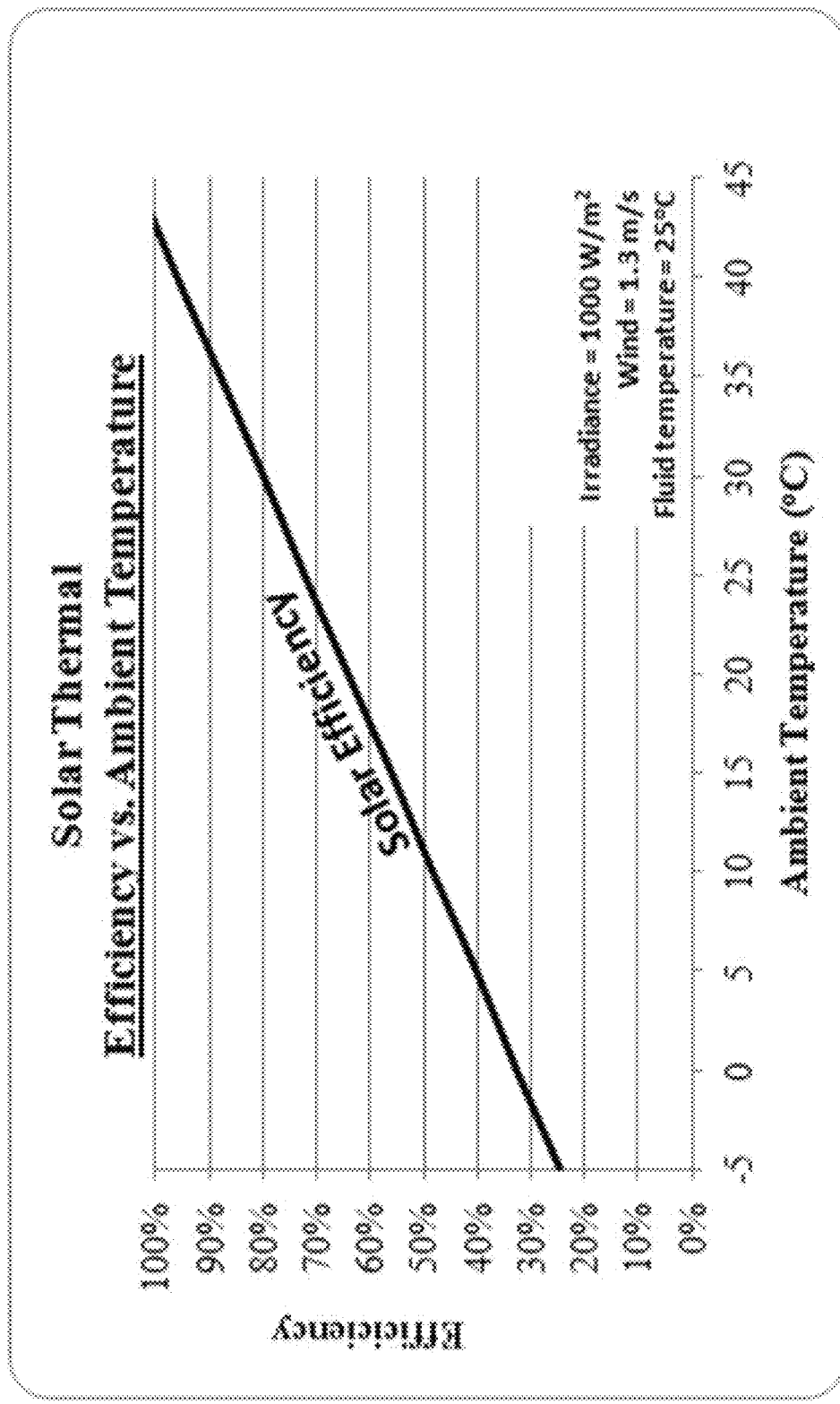
FIG. 10 is a plot of efficiency against temperature for a thermal solar module according to an embodiment of the present invention.

FIG. 10 is a plot of efficiency against temperature for a thermal solar module according to an embodiment of the present invention. This diagram is merely an example, which should not unduly limit the scope of the claims herein. As shown, efficiency generally increases with increasing temperature.

Figure 11:
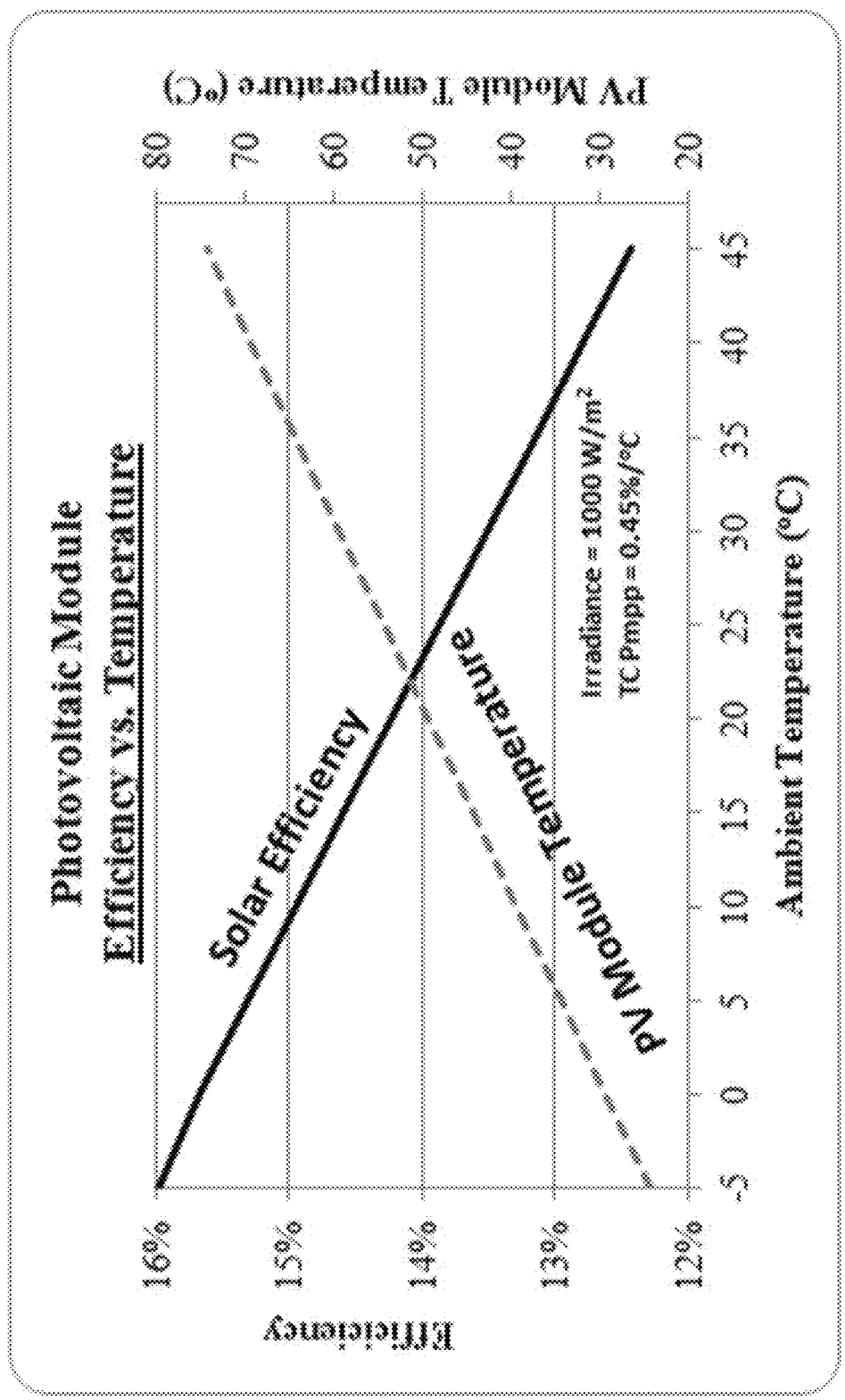
FIG. 11 is a plot of efficiency against temperature for a photovoltaic module according to an embodiment of the present invention.

FIG. 11 is a plot of efficiency against temperature for a photovoltaic module according to an embodiment of the present invention. This diagram is merely an example, which should not unduly limit the scope of the claims herein. As shown, efficiency decreases, for silicon based modules, with increasing temperature.

Figure 12:
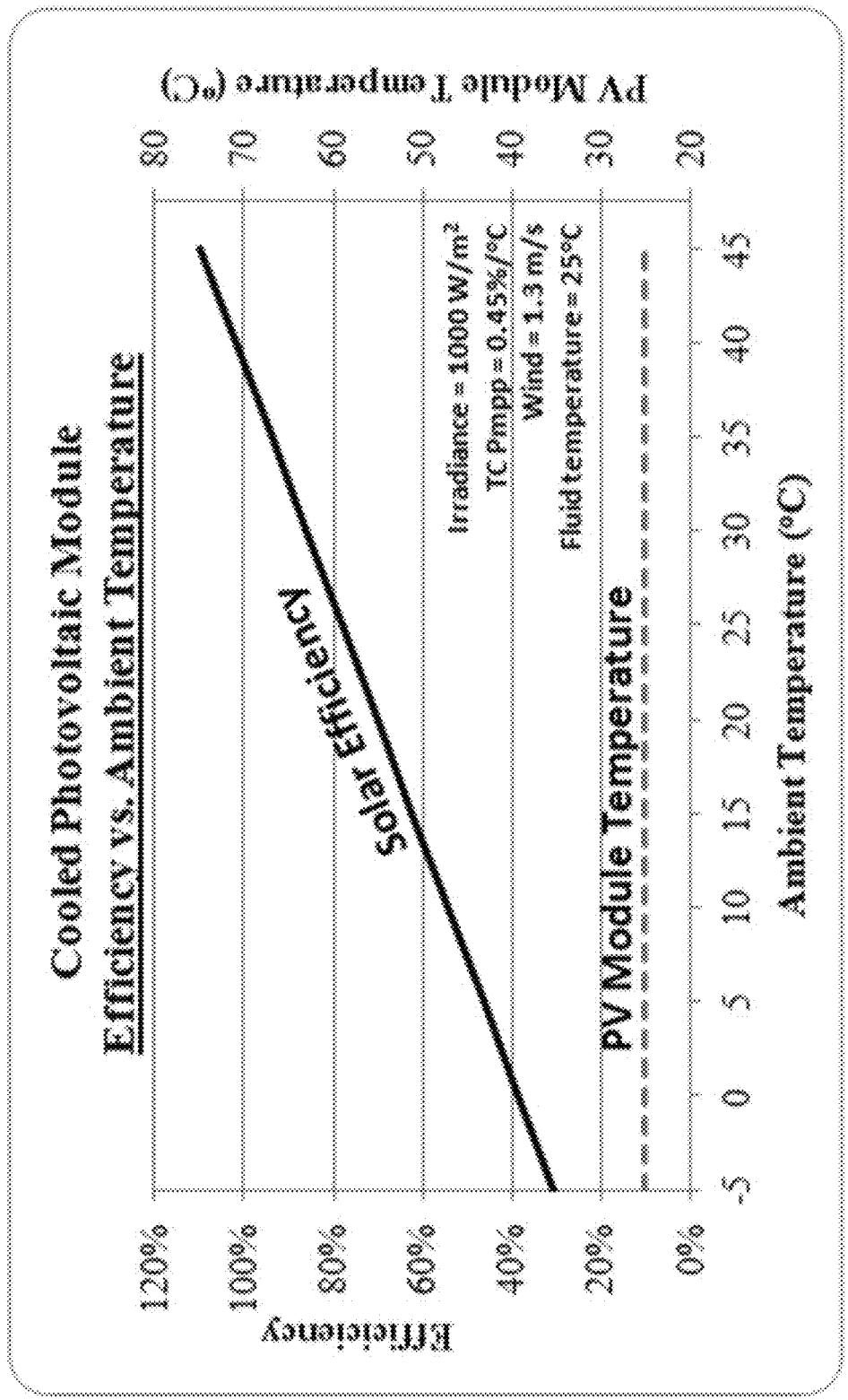
FIG. 12 is a plot of efficiency against temperature for a cooled photovoltaic module in an assembly according to an embodiment of the present invention.

FIG. 12 is a plot of efficiency against temperature for a cooled photovoltaic module in an assembly according to an embodiment of the present invention. This diagram is merely an example, which should not unduly limit the scope of the claims herein. As shown, the temperature of the photovoltaic module is fairly consistent thereby increasing overall efficiency in the assembly.

In an example, the invention provides a fluid cooled photovoltaic module assembly. The assembly has a photovoltaic module comprising a frame structure. In an example, the photovoltaic module comprises a plurality of silicon based cells or thin film based cells. In an example, the photovoltaic module comprises a glass aperture region, and a backside region. In an example, the photovoltaic module is capable of being operable as a stand alone unit. In an example, the backside region comprises a backsheet, which is made of a glass or a polymer backsheet or a metal material, or others. In an example, the assembly includes a polymer based thickness of material comprising a plurality of tubes extending from a first end to a second end, a first manifold coupled to the plurality of tubes on the first end to gather fluid from each of the plurality of fluids, and a second manifold coupled to the plurality of tubes on the second end to gather fluid from each of the plurality of fluids. In an example, the assembly has an interface region characterizing the backside region and an upper surface region of the polymer based thickness of material. In an example, the interface region is substantially free from any voids or gaps and characterized by a substantially continuous temperature profile between the backside region and the upper surface region. In an example, the assembly has a mounting assembly configured to press the photovoltaic module to the polymer based thickness of material such that the interface region has the continuous temperature profile.

In an example, the photovoltaic module is frameless. In an example, the fluid comprises water or other liquid. In an example, the polymer based thickness is comprised of polymers such as polypropylene, polyethylene or rubber or others, In an example, the polymer based thickness of material is a homogeneous structure.

In an example, the photovoltaic module is free from glass or is configured in a frameless manner and is free from glass or wherein the photovoltaic module comprises a top glass sheet coupled to a back glass sheet. In an example, the photovoltaic module is black in color including the backsheet and a frame for increased heat output. In an example, the photovoltaic module has the glass backsheet and a plurality of transparent areas between each of the photovoltaic cells, which allows electromagnetic radiation derived from the sun to shine directly onto exposed portions of the polymer backsheet.

In an example, the polymer based thickness, the first heat manifold, and the second manifold are configured as a polymer heat exchanger adaptable to either a portrait or landscape mounting orientations. In an example, the polymer based thickness is a tube sheet with 100 to 300 tubes in parallel with each other. In an example, the polymer based thickness, the first heat manifold, and the second manifold are configured as a polymer heat exchanger has a one or more serpentine tubes. In an example, the polymer based thickness, the first heat manifold, and the second manifold are configured as a polymer heat exchanger is thin film with integral tube flow channels.

In an example, the polymer based thickness, the first heat manifold, and the second manifold are configured as a polymer heat exchanger is 39+/−3" wide×66"+/−3" long intended for a 60 crystalline silicon cell photovoltaic module or wherein the polymer based thickness, the first heat manifold, and the second manifold are configured as a polymer heat exchanger is 39+/−3" wide×78"+/−3" long intended for a 72 crystalline silicon cell photovoltaic module or wherein the polymer based thickness, the first heat manifold, and the second manifold are configured as a polymer heat exchanger is 42+/−3" wide×62"+/−3" long intended for a 96 crystalline silicon cell photovoltaic module. In an example, the polymer based thickness, the first heat manifold, and the second manifold are configured as a polymer heat exchanger is 39+/−3" wide×81"+/−3" long intended for a 128 crystalline silicon cell photovoltaic module. In an example, the polymer based thickness, the first heat manifold, and the second manifold are configured as a polymer heat exchanger is routed around the photovoltaic module junction box.

In an example, the assembly further comprising with one or more conductive elements to promote junction box and peripheral photovoltaic module cooling. In an example, the assembly comprising a mounting configuration optimized for low slope roofs. In an example, the photovoltaic module is comprised of crystalline silicon front contact cells. In an example, the photovoltaic module is comprised of crystalline silicon back contact cells. In an example, the photovoltaic module is thin film selected from at least one of cadmium telluride (CdTe), copper indium gallium selenide (CIGS), and amorphous silicon (a-Si), or combinations thereof.

In an example, the assembly further comprising a microinverter or optimizer is mounted to the photovoltaic module. In an example, the assembly further comprising a microinverter or optimizer is cooled by the polymer based thickness of material. In an example, the assembly further comprising a photovoltaic junction box is cooled by a polymer heat exchanger configured from the polymer based thickness of material. In an example, the apparatus is assembled at a factory, warehouse, jobsite ground or in final mounting position.

In an example, the thickness of polymer material is made of a polymer or combination of polymers including at least one of polyethylene, polypropylene, or rubber. In an example, the polymer based thickness, the first heat manifold, and the second manifold are configured as a polymer heat exchanger configured as an unglazed polymer solar collector provided for heating swimming pools and preheating water as stand alone units. In an example the photovoltaic module is semi-transparent and is configured with a polymer heat exchanger to increase electrical performance by a lowering of a photovoltaic module temperature, enhanced thermal performance by utilizing a solar radiation through the semi-transparent photovoltaic module, and enhanced thermal performance by lowering wind and other losses effectively glazing the polymer heat exchanger.

Figure 13:
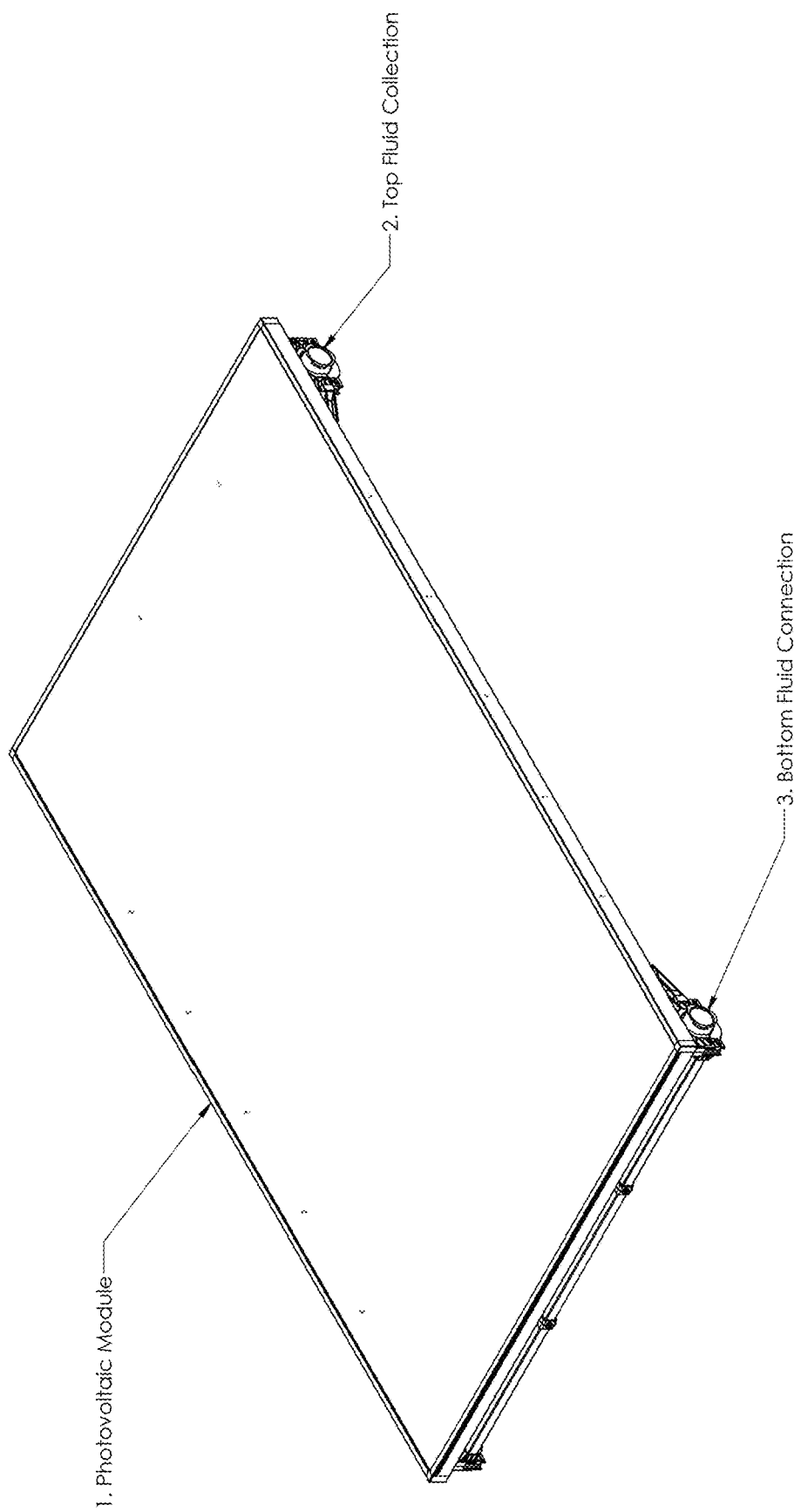
FIG. 13 is a perspective view of an assembly according to an embodiment of the present invention.
Figure 14:
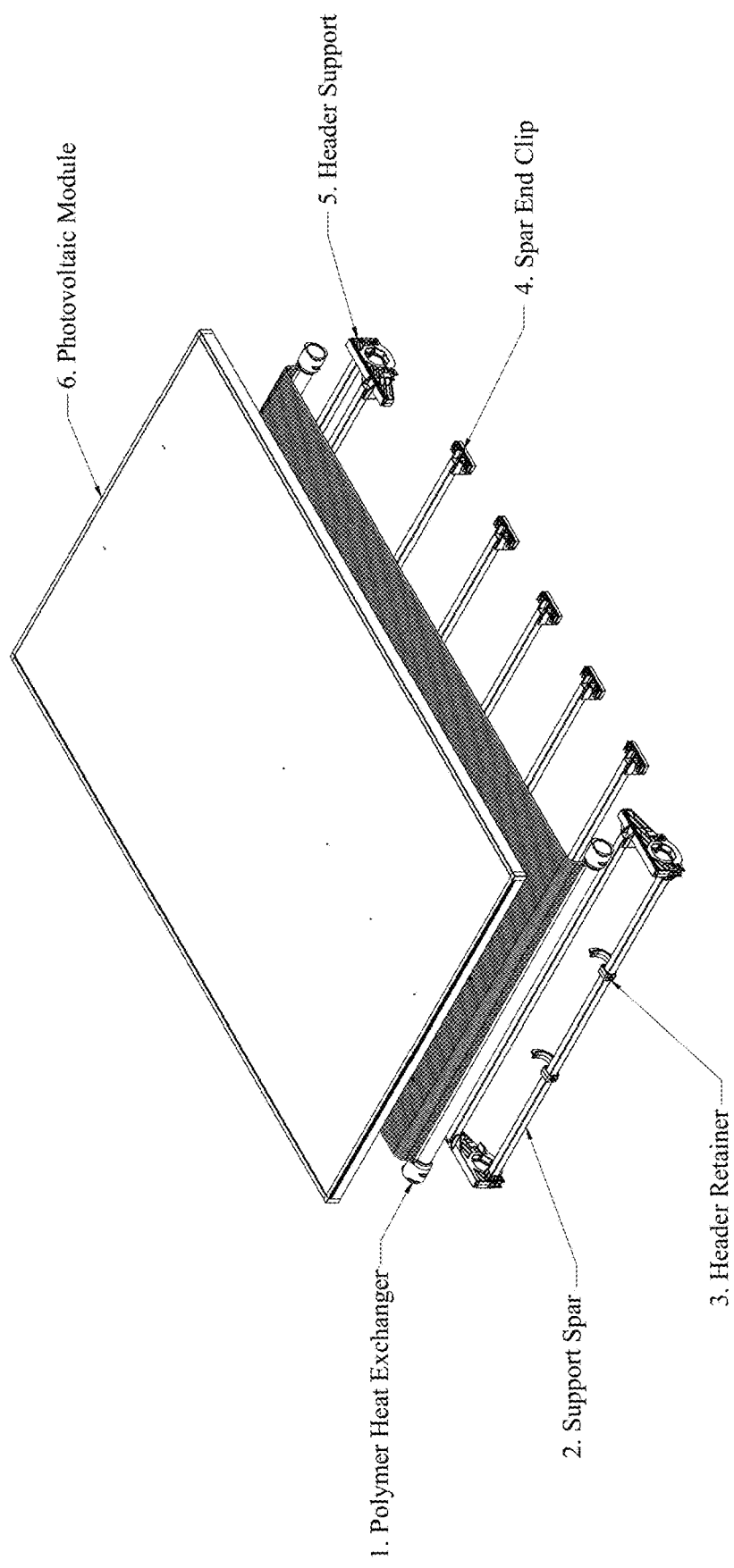
FIG. 14 is an exploded view of an assembly according to an embodiment of the present invention.

An alternative assembly with photovoltaic module 1, top fluid connection 2, and bottom fluid connection 3 is shown in FIG. 13. An exploded view of the assembly in FIG. 14 shows a polymer heat exchanger 1 between a photovoltaic module 6 and an assembly back structure including support spars 2, header retainers 3, spar end clips 4, and header supports 5. The photovoltaic module can include a plurality of silicon based cells or thin film based cells. This photovoltaic module can also have a PV front region and a PV back region. In a specific embodiment, a frame surrounds the photovoltaic module.

The polymer heat exchanger 1 can be a thermal collector module that includes a thickness of polymer based material having a plurality of tubes extending from a first end to a second end. This thickness of polymer based material can have a collector front region and a collector back region. The thermal collector module can include a first manifold coupled to the plurality of tubes on the first end to gather fluid from each of the plurality of tubes. The thermal collector module can also include a second manifold coupled to the plurality of tubes on the second end to gather fluid from each of the plurality of tubes as well.

In an embodiment, an interface region characterizes the PV back region and the collector front region. This interface region is characterized by substantially continuous contact between the PV back region and the collector front region. This interface region is similar to the configuration described in FIG. 9, in which the polymer heat exchanger is in direct contact with the back of the photovoltaic module. However, a back structure is used instead of a backsheet. This back structure is configured to press the thickness of polymer based material against the PV module such that the interface region maintains a substantially continuous contact.

Figure 15:
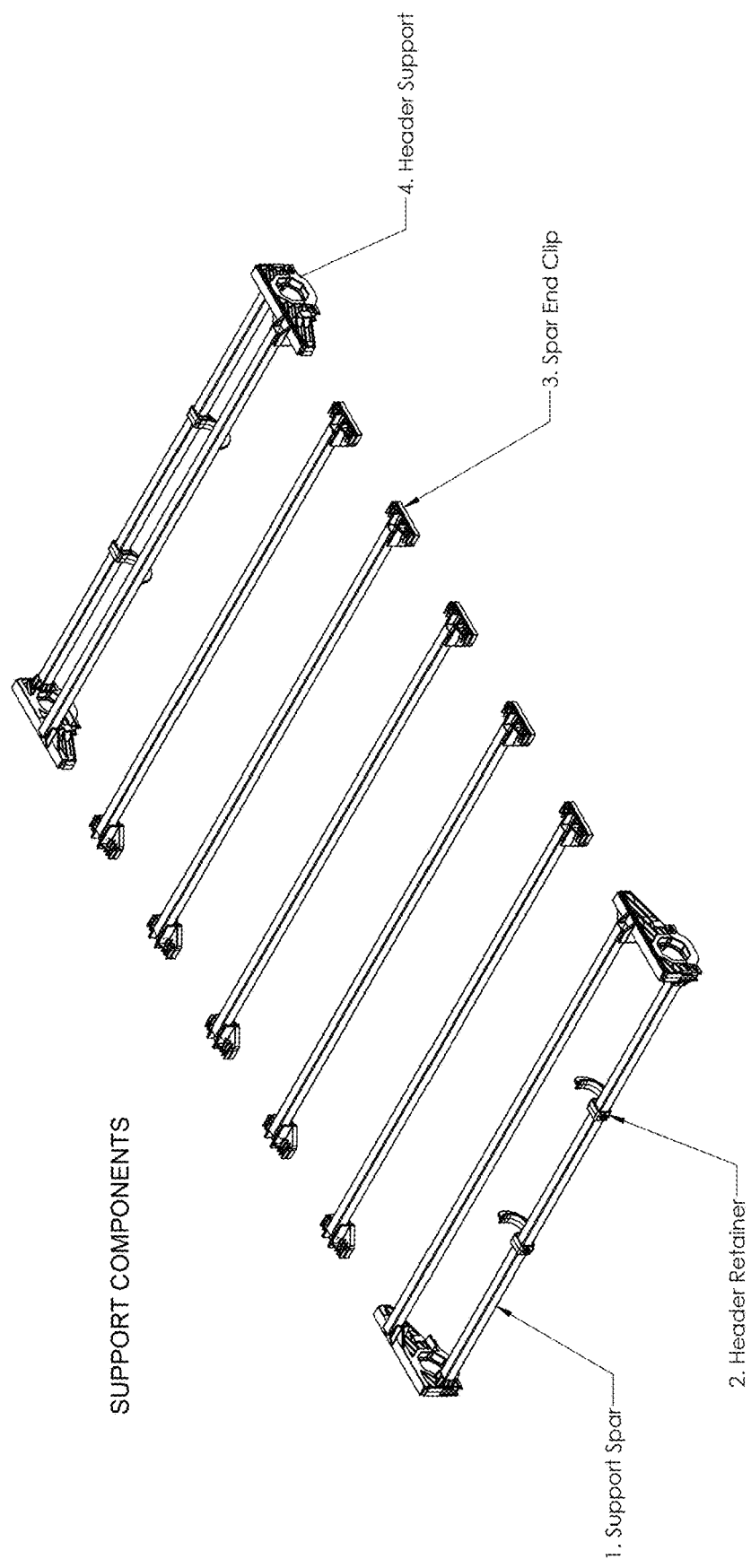
FIG. 15 is a perspective view of assembly support components according to an embodiment of the present invention.

FIG. 15 is a perspective view of assembly support components according to an embodiment of the present invention. In an embodiment, the back structure includes two header structures (one for each manifold). Each of the header structures can include a pair of header supports coupled by one or more support spars. One of these spars on the header structure can be configured with one or more header retainers. The pair of header supports can be configured on a first end and a second end of the manifold, while the one or more header retainers contact the sections of the manifold between the first and second ends. In a specific embodiment, the header supports are physically coupled to the frame of the photovoltaic module. The header retainers further secure the manifolds of the thermal collector against the PV back region. These header supports In an embodiment, the back structure includes a plurality of spar structures. The plurality of spar structures are configured between the two header structures and are also physically coupled to the frame. In a specific embodiment, the PV module includes a frame having a first frame side and a second frame side. The plurality of spar structures are coupled to the frame such that the thickness of polymer material is pressed against the PV module causing the interface region to maintain the substantially continuous contact. The plurality of spar structures can be configured at periodic intervals across the PV back region.

Figure 16:
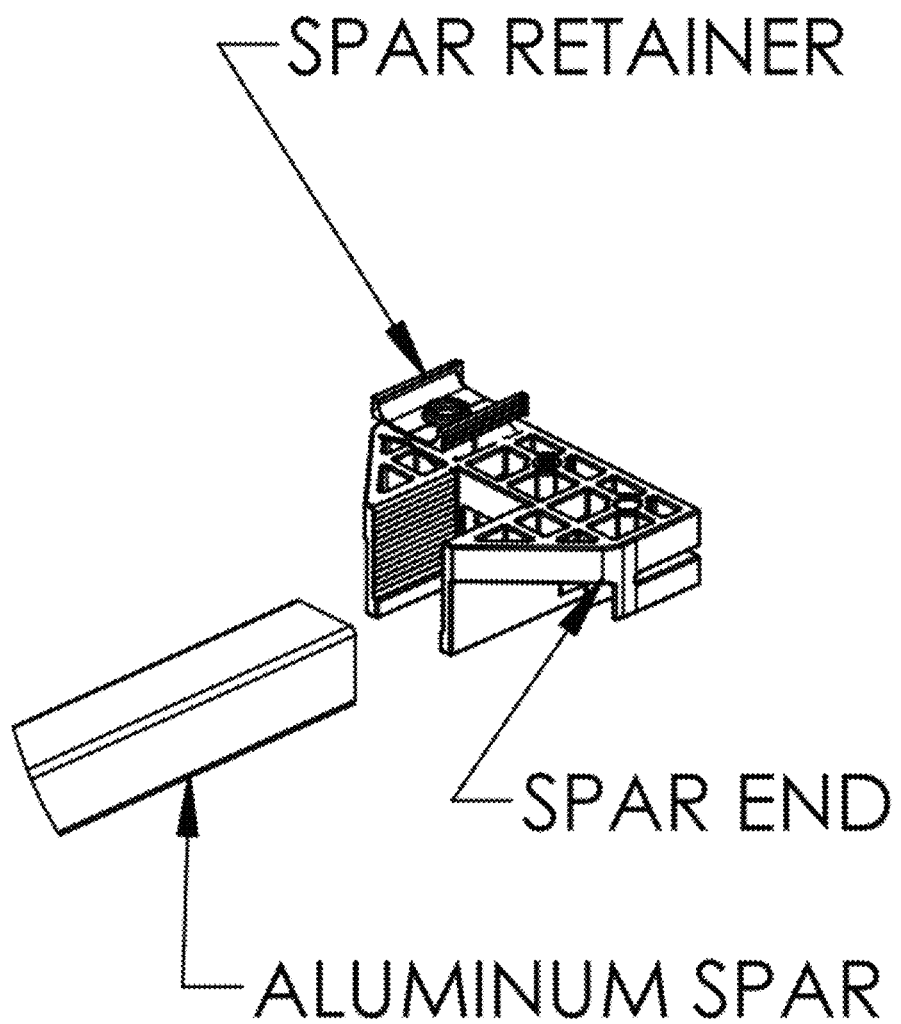
FIG. 16 is a perspective view of a spar structure according to an embodiment of the present invention.

FIG. 16 is a perspective view of a spar structure according to an embodiment of the present invention. In an embodiment, the each of the spar structures includes a spar, a first spar support, and a second spar support. The spar has a first end, which is coupled to the first frame side by the first spar support, and a second end, which is coupled to the second frame side by the second spar support. Each of these spar supports can include a spar mount/spar end and a spar retainer. Similar to the header supports, the spar mounts/spar ends are physically coupled to the frame, while the spar retainers couple the spars to the spar mounts.

In various embodiments, the back structure having header structures and spar structures can be easily attached and removed with the use of a single tool, such as an allen wrench, or the like. The spars can be made of aluminum, or other light-weight and sturdy materials. Other parts can be made of polymers such as nylon, or the like. Embodiments of the present invention provide a practical and commercially viable fluid cooled PV module assembly that is a simple, low-cost, easy to assemble/disassemble, easily automated, light weight (≤4 PSF), and achieves thermal contact with minimal pressure.

In an embodiment, the PV front region can free from glass, include a glass front sheet, or the like. The PV back region can include a glass back sheet, a polymer back sheet, or the like. The photovoltaic module can also be a frameless PV module. Also, the assembly can include DC to AC conversion devices typical of, but not limited to, micro inverters, string inverters, optimizers, or the like. In other cases, DC to AC conversion devices are not used.

Similar to the assembly of FIG. 1, the polymer heat exchanger can be mounted either in a portrait or landscape orientation. The components can be assembled at a factory, warehouse, jobsite, ground or in final mounting position. The components can be configured into a photovoltaic module cooling kit that is provided to others (i.e. manufacturers, distributors, contractors, etc.) to integrate into their photovoltaic modules.

Figure 17:
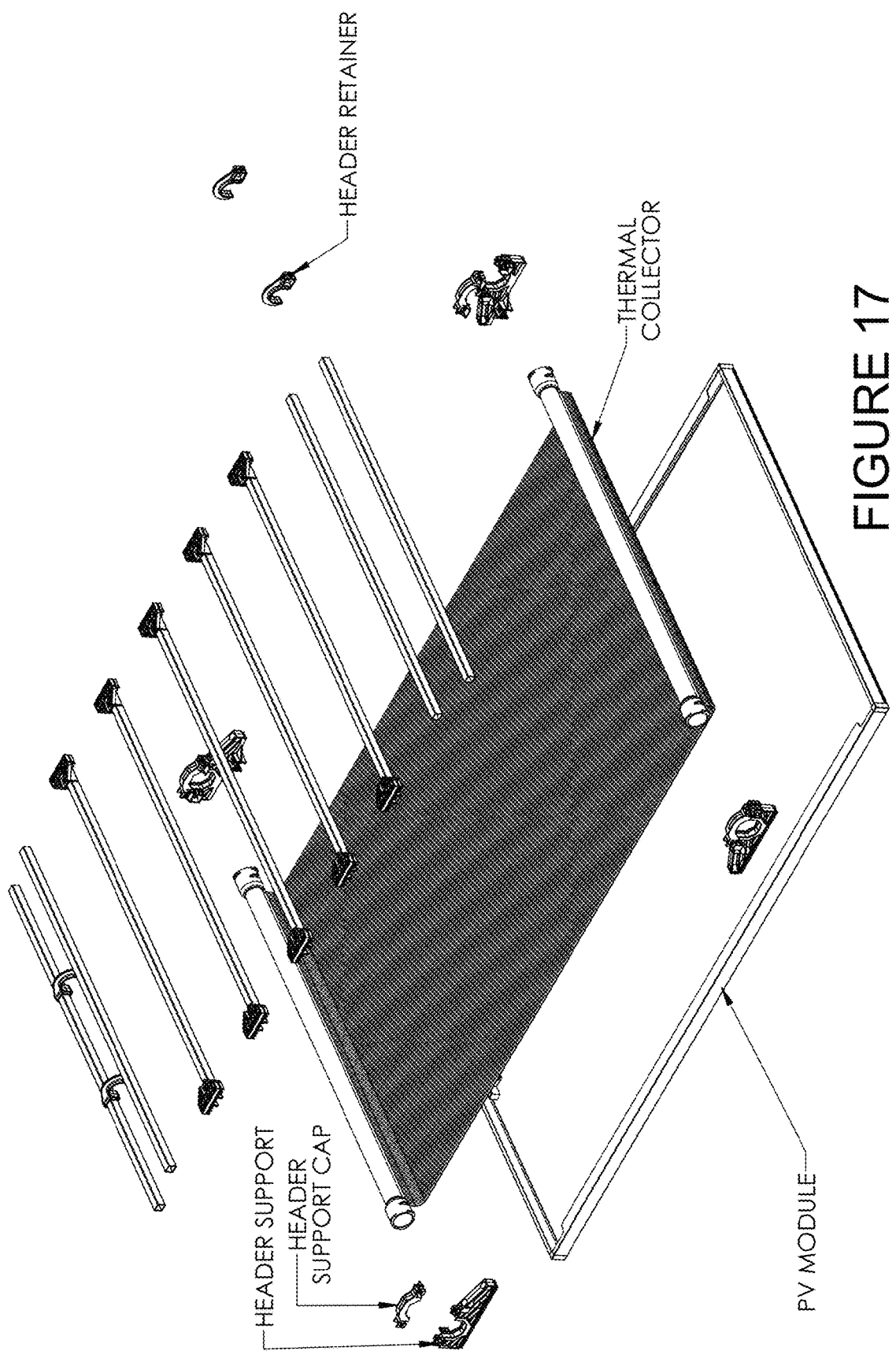
FIG. 17 is an exploded view of an assembly according to an embodiment of the present invention.

FIG. 17 shows another exploded view from the opposite side shown in FIG. 13. Here, we also see additional details for the header/manifold support, which can include a header support cap and a header support. In an embodiment, the manifold support includes a manifold mount and a manifold cap. The manifold mounts can be coupled to the first frame side and second frame side of the PV frame as described previously. The manifold caps can be coupled to the manifold mounts such that the first and second ends of the manifolds of the thermal collector module are attached to the PV frame.

As described previously, effective heat transfer between the photovoltaic module and polymer heat exchanger is dependent upon by direct contact between the back surface of the photovoltaic module and top surface of the polymer heat exchanger. This effective heat transfer is enabled within this embodiment with the back structure that applies constant pressure to the back of the polymer heat exchanger. This configuration provides a large available heat transfer area of the polymer heat exchanger, a thin wall tube sheet with semi-conductive commodity polymers (polyethylene or polypropylene), uniform flow of the polymer heat exchanger, complete coverage behind PV cells and slight thermal conductance of the composite. Testing has shown the heat output of this assembly to be comparable to the high efficient output of unglazed solar pool heating collectors.

Figure 18:
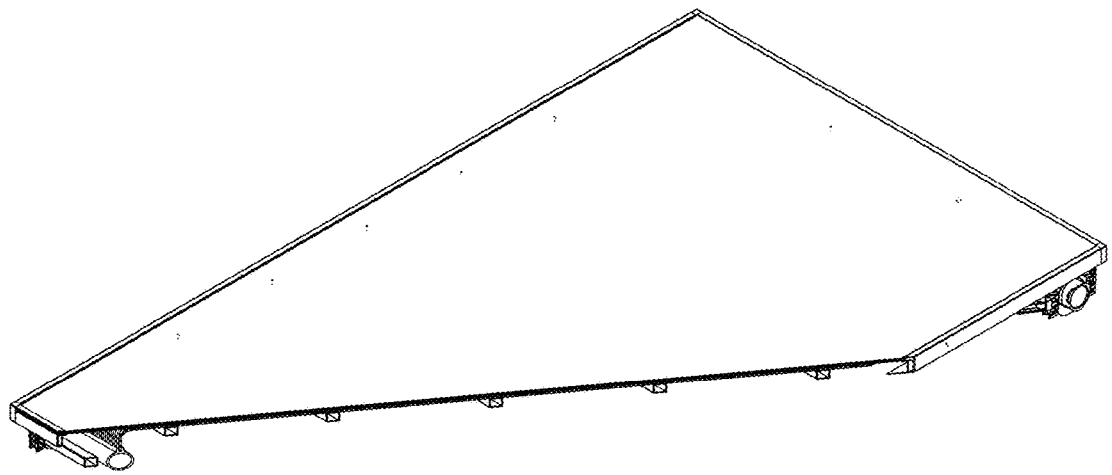
FIGS. 18 and 19 are various alternative views of an assembly according to an embodiment of the present invention.
Figure 19:
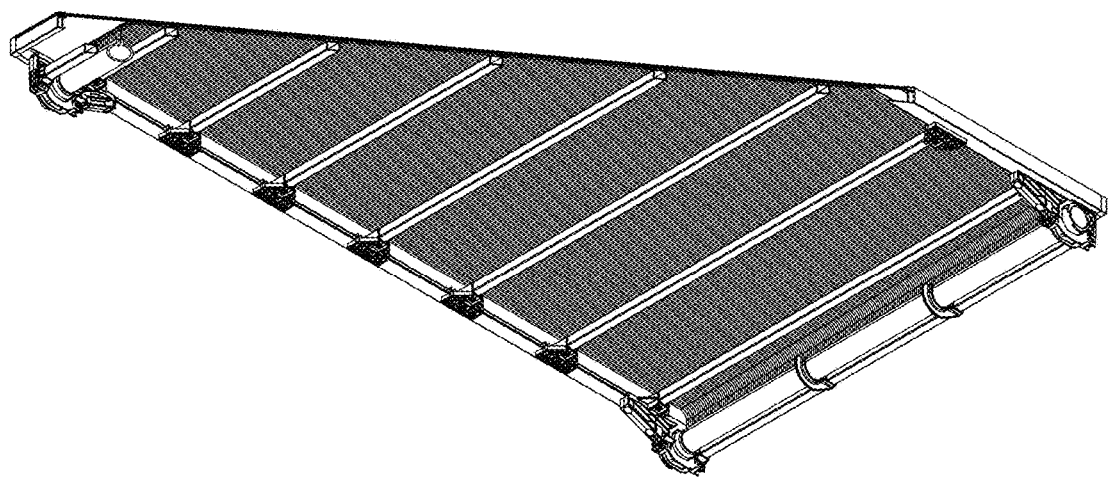

Cross sections of this assembly are shown in FIG. 18 and FIG. 19. FIG. 18 shows a cross-sectional perspective view from the PV module side of the assembly, while FIG. 19 shows a cross-sectional perspective view from the back structure side. In this figure, we can see the cross-sections of the spars evenly distributed across the back region of the PV module. In a specific embodiment, the thickness of polymer based material is bent at nominally 90 degrees at the first end and the second end to substantially maintain longitudinal alignment of the thermal collector module. This 90 degree bend can be seen near the cross section of the manifold, which is at the narrow end of the assembly cross section.

In addition to the benefits of the intimate contact between the PV module and the thermal collector module, the 90 degree bend of the polymer tube sheet also provides many benefits. These benefits include facilitating the flowing of cooling fluid in and out of the respective headers/manifolds without modifying the frame of the PV module. This construction also allows header-to-frame attachment such that the tube sheet bend absorbs CTE (Coefficient of Thermal Expansion) or reduces the effects of CTE. This effect assists in maintaining longitudinal alignment of the headers/manifolds.

Figure 20:
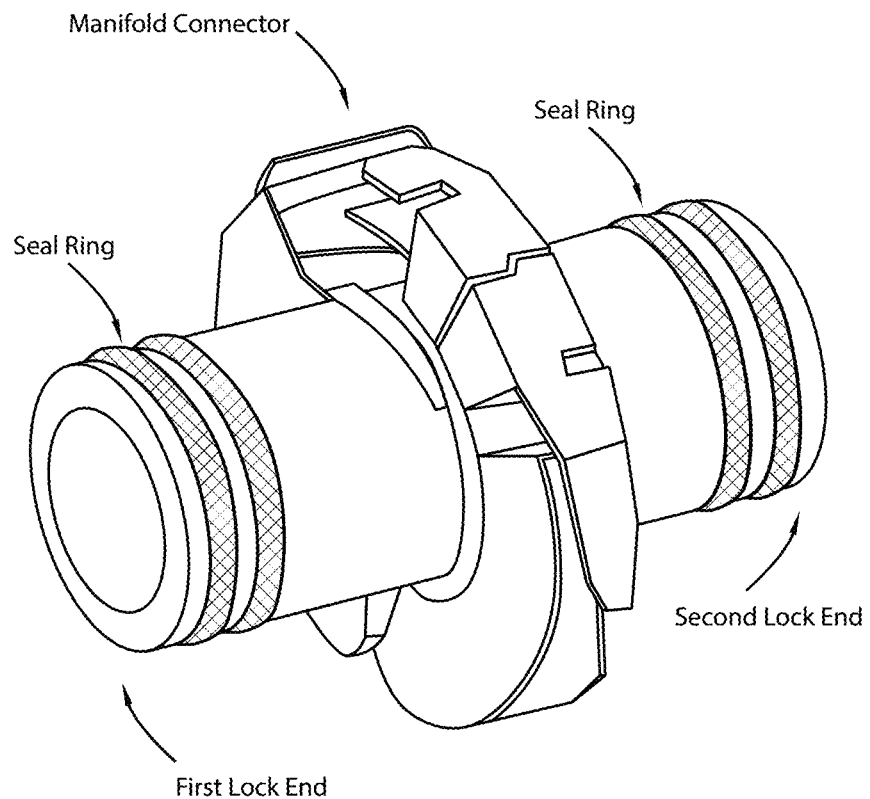
FIG. 20 is a perspective view of a manifold connector according to an embodiment of the present invention.

FIG. 20 is a perspective view of a manifold connector according to an embodiment of the present invention. As shown, the manifold connector includes a twist lock mechanism having a first lock end and a second lock end. These manifold connectors can be configured at the ends of the manifolds of the thermal collector module. This twist lock mechanism can be configured for simple insertion and extraction of the fluid cooled PV module assembly. One or more seal rings can be provided on each end of the twist lock mechanism. These seal rings can be configured to substantially maintain lateral alignment.

Along with the 90 degree tube sheet bend that maintains header alignment, these manifold collectors facilitates the use of seal rings to provide internal seals for lateral differential CTE. Using these internal seal rings allows the use of a face seal, which allows these fluid cooled PV module assemblies to be easily connected to each other for installation and easily removed from each other for repairs and uninstallation. The use of these features also facilitates relatively large flow rates with minimum back pressure. In a specific embodiment, the use of headers bent at nominally 90 degrees allows alignment which accommodates seals that ensure leak-free operation for the life of the product (over 25 years) while maintaining low back pressure.

In various embodiments, the fluid cooled PV module assembly achieves high thermal transfer without significantly raising the PV module stagnation temperature, which was described previously. Other conventional embodiments try to achieve intimate thermal heat transfer by insulating the back to effectively create an oven. This kind of approach is heavy, takes up room, is costly, but worst of all, it can substantially lower the PVT system performance. Without fluid-cooling, these kinds of PVT designs may raise the stagnation temperatures as much as 30 degrees, which will substantially degrade system performance.

Various example embodiments as described with reference to the accompanying drawings, in which embodiments have been shown. This inventive concept may, however, be embodied in many different forms and should not be construed as limited to the embodiments set forth herein. Rather, these embodiments are provided so that this disclosure is thorough and complete, and has fully conveyed the scope of the inventive concept to those skilled in the art. Like reference numerals refer to like elements throughout this application.

It has been understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

It has be understood that when an element is referred to as being "connected" or "coupled" to another element, it can be directly connected or coupled to the other element or intervening elements may be present. In contrast, when an element is referred to as being "directly connected" or "directly coupled" to another element, there may be no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which this inventive concept belongs. It has been be further understood that terms, such as those defined in commonly used dictionaries, should be interpreted as having a meaning that is consistent with their meaning in the context of the relevant art and will not be interpreted in an idealized or overly formal sense unless expressly so defined herein.

It should be understood that the description recited above is an example of the disclosure and that modifications and changes to the examples may be undertaken which are within the scope of the claimed disclosure. In an example, the thermal solar module can be The Sungrabber™ Solar Collector is manufactured by FAFCO Incorporated in Chico, Calif., but can be others. The collector is a specially developed, highly stabilized polyolefin and is of parallel, circular channel design. It is unglazed, un-insulated, and designed for low temperature applications such as swimming pool heating, heat pumps, aquaculture, and hydroponics. Therefore, the scope of the appended claims should be accorded the broadest interpretation so as to encompass all such modifications and similar arrangements, including a full scope of equivalents.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A fluid cooled photovoltaic (PV) module assembly, the assembly comprising:
   a photovoltaic (PV) module comprising:
      a plurality of silicon based cells or thin film based cells,
      a PV front region, and
      a PV back region;
   a thermal collector module comprising:
      a thickness of polymer based material having a plurality of tubes extending from a first end to a second end, the thickness of polymer based material having a collector front region and a collector back region,
      a first manifold coupled to the plurality of tubes on the first end to provide fluid to each of the plurality of tubes, and
      a second manifold coupled to the plurality of tubes on the second end to gather fluid from each of the plurality of tubes;
   an interface region characterizing the PV back region and the collector front region, the interface region being characterized by contact between the PV back region and the collector front region; and
   a back structure configured to press the thickness of polymer based material against the PV module such that the interface region maintains the contact,
   wherein the plurality of tubes extend from the first manifold towards the PV module at the first end, bend to be parallel to the PV back region, and bend from the PV module towards the second manifold at the second end.

2. The assembly of claim 1 wherein the plurality of tubes includes from 100 to 300 individual tubes.

3. The assembly of claim 1 wherein the PV back region includes a glass back sheet or a polymer back sheet.

4. The assembly of claim 1 wherein the thickness of polymer based material is bent at 90 degrees at the first end and the second end and maintains longitudinal alignment of the thermal collector module.

5. The assembly of claim 1 wherein the PV module comprises a frame having a first frame side and a second frame side; and
   wherein the back structure comprises a plurality of spar structures coupled to the frame, the spar structures being configured to press the thickness of polymer based material against the PV module such that the interface region maintains the contact.

6. The assembly of claim 5 wherein each of the spar structures comprises
   a spar having a first spar end and a second spar end,
   a first spar support coupled to the first spar end and to the first frame side, and
   a second spar support coupled to the second spar end and to the second frame side.

7. The assembly of claim 6 wherein each of the first spar supports comprises a first spar mount and a first spar retainer, wherein the first spar mount is coupled to the first frame side and the first spar retainer couples the first spar end to the first spar mount; and
   wherein each of the second spar supports comprises a second spar mount and a second spar retainer, wherein the second spar mount is coupled to the second frame side and the second spar retainer couples the second spar end to the second spar mount.

8. The assembly of claim 1 wherein the first manifold comprises a first manifold first end and a first manifold second end and the second manifold comprises a second manifold first end and a second manifold second end; and
   further comprising a manifold connector coupled to each end of the first manifold and each end of the second manifold, wherein each manifold connector comprises
   a twist lock mechanism having a first lock end and a second lock end, the twist lock mechanism being configured for insertion and extraction of the fluid cooled PV module assembly, and
   one or more seal rings provided on each end of the twist lock mechanism, the one or more seal rings being configured to maintain lateral alignment.

9. The assembly of claim 1 further comprising one or more AC-to-DC conversion devices including microinverters, string inverters, or optimizers.

10. A fluid cooled photovoltaic (PV) module assembly, the assembly comprising:
    a photovoltaic (PV) module comprising
       a plurality of silicon based cells or thin film based cells,
       a frame having a first frame side and a second frame side;
       a PV front region, and
       a PV back region;
    a thermal collector module comprising
       a thickness of polymer based material having a plurality of tubes extending from a first end to a second end, the thickness of polymer based material having a collector front region and a collector back region,
       a first manifold coupled to the plurality of tubes on the first end to provide fluid to each of the plurality of tubes, wherein the first manifold comprises a first manifold first end and a first manifold second end,
       a pair of first manifold supports configured to couple the first manifold to the frame of the PV module,
       a second manifold coupled to the plurality of tubes on the second end to gather fluid from each of the plurality of tubes, wherein the second manifold comprises a second manifold first end and a second manifold second end, and
       a pair of second manifold supports configured to couple the second manifold to the frame of the PV module;
    an interface region characterizing the PV back region and the collector front region, the interface region being characterized by continuous contact between the PV back region and the collector front region; and
    a back structure configured to press the thickness of polymer based material against the PV module such that the interface region maintains the continuous contact,
    wherein the plurality of tubes extend from the first manifold towards the PV module at the first end, bend to be parallel to the PV back region, and bend from the PV module towards the second manifold at the second end.

11. The assembly of claim 10 wherein the plurality of tubes includes from 100 to 300 individual tubes.

12. The assembly of claim 10 wherein the PV back region includes a glass back sheet or a polymer back sheet.

13. The assembly of claim 10 wherein the thickness of polymer based material is bent at 90 degrees at the first end and the second end to maintain alignment of the thermal collector module.

14. The assembly of claim 10 wherein each of the pair of first manifold supports comprises a first manifold mount and a first manifold cap; and wherein each of the pair of second manifold supports comprises a second manifold mount and a second manifold cap.

15. The assembly of claim 14 wherein the first manifold mounts are coupled to the first frame side and the second frame side, and the first manifold caps couple the first and second ends of the first manifold to the first manifold mounts; and
wherein the second manifold mounts are coupled to the first frame side and the second frame side, and the second manifold caps couple the first and second ends of the second manifold to the second manifold mounts.

16. The assembly of claim 10 wherein the back structure comprises a plurality of spar structures coupled to the frame, the plurality of spar structures being configured to press the thickness of polymer based material against the PV module such that the interface region maintains the continuous contact; and
wherein the each of the plurality of spar structures comprises:
a spar having a first spar end and a second spar end,
a first spar support coupled to the first spar end and to the first frame side, and
a second spar support coupled to the second spar end and to the second frame side.

17. The assembly of claim 16 wherein each of the first spar supports comprises a first spar mount and a first spar retainer,
wherein each first spar mount is coupled to the first frame side and each first spar retainer couples the respective first spar end to the respective first spar mount; and
wherein each of the second spar supports comprises a second spar mount and a second spar retainer, and
wherein each second spar mount is coupled to the second frame side and each second spar retainer couples the respective second spar end to the respective second spar mount.

18. The assembly of claim 10 wherein the first manifold comprises a first manifold first end and a first manifold second end and the second manifold comprises a second manifold first end and a second manifold second end; and
further comprising a manifold connector coupled to each end of the first manifold and each end of the second manifold, wherein each manifold connector comprises:
a twist lock mechanism having a first lock end and a second lock end, the twist lock mechanism being configured for insertion and extraction of the fluid cooled PV module assembly, and
one or more seal rings provided on each end of the twist lock mechanism, the one or more seal rings being configured to maintain lateral alignment.

19. A fluid cooled photovoltaic (PV) module assembly, the assembly comprising:
a photovoltaic (PV) module comprising:
a plurality of silicon based cells or thin film based cells,
a frame having a first frame side and a second frame side;
a PV front region, and
a PV back region;
a thermal collector module comprising:
a thickness of polymer based material having a plurality of tubes extending from a first end to a second end, the thickness of polymer based material having a collector front region and a collector back region,
a first manifold coupled to the plurality of tubes on the first end to provide fluid to each of the plurality of tubes,
a pair of first manifold supports configured to couple the first manifold to the frame of the PV module,
a second manifold coupled to the plurality of tubes on the second end to gather fluid from each of the plurality of tubes, and
a pair of second manifold supports configured to couple the second manifold to the frame of the PV module;
an interface region characterizing the PV back region and the collector front region, the interface region being characterized by a contact between the PV back region and the collector front region; and
a back structure configured to press the thickness of polymer based material against the PV module such that the interface region maintains the contact, wherein the back structure comprises a plurality of spar structures coupled to the frame, the spar structures being configured to press the thickness of polymer based material against the PV module such that the interface region maintains the contact,
wherein the plurality of tubes extend from the first manifold towards the PV module at the first end, bend to be parallel to the PV back region, and bend from the PV module towards the second manifold at the second end.

* * * * *